(12) United States Patent
Huang et al.

(10) Patent No.: US 12,660,600 B2
(45) Date of Patent: Jun. 16, 2026

(54) STRUCTURE AND METHOD FOR TRANSISTORS HAVING BACKSIDE POWER RAILS

(71) Applicant: Taiwan Semiconductor Manufacturing Co., Ltd., Hsin-Chu (TW)

(72) Inventors: Yu-Xuan Huang, Hsinchu (TW); Ching-Wei Tsai, Hsinchu City (TW); Cheng-Ting Chung, Hsinchu City (TW); Cheng-Chi Chuang, New Taipei City (TW); Shang-Wen Chang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 995 days.

(21) Appl. No.: 17/815,119

(22) Filed: Jul. 26, 2022

(65) Prior Publication Data

US 2022/0375860 A1     Nov. 24, 2022

Related U.S. Application Data

(62) Division of application No. 16/947,390, filed on Jul. 30, 2020, now Pat. No. 11,532,556.

(Continued)

(51) Int. Cl.
*H10W 20/41* (2026.01)
*H10D 30/01* (2025.01)
(Continued)

(52) U.S. Cl.
CPC ........ *H10W 20/427* (2026.01); *H10D 30/024* (2025.01); *H10D 30/62* (2025.01);
(Continued)

(58) Field of Classification Search
CPC .. H10D 30/024; H10D 30/62; H10D 84/0158; H10D 84/834; H10D 84/853;
(Continued)

(56) References Cited

U.S. PATENT DOCUMENTS

| | | | | |
|---|---|---|---|---|
| 6,395,589 B1 * | 5/2002 | Yu | ....................... | H10D 30/6739 |
| | | | | 438/300 |
| 6,583,045 B1 * | 6/2003 | Liu | ........................ | H10D 86/01 |
| | | | | 257/276 |

(Continued)

FOREIGN PATENT DOCUMENTS

| | | |
|---|---|---|
| CN | 1823413 A | 8/2006 |
| CN | 202601575 U | 12/2012 |

(Continued)

OTHER PUBLICATIONS

Notice of Allowance mailed Jan. 25, 2023 in Korean Intellectual Property Office in Application No. 10-2020-0149415 ; 8 pages.

*Primary Examiner* — Mary A Wilczewski
(74) *Attorney, Agent, or Firm* — HAYNES AND BOONE, LLP

(57) ABSTRACT

The present disclosure provides one embodiment of a semiconductor structure. The semiconductor structure includes a substrate having a front side and a back side; a gate stack formed on the front side of the substrate and disposed on an active region of the substrate; a first source/drain feature formed on the active region and disposed at an edge of the gate stack; a backside power rail formed on the back side of the substrate; and a backside contact feature interposed between the backside power rail and the first source/drain feature, and electrically connecting the backside power rail to the first source/drain feature. The backside contact feature further includes a first silicide layer on the back side of the substrate and directly contacting a bottom surface of the first source/drain feature.

20 Claims, 27 Drawing Sheets

Related U.S. Application Data

(60) Provisional application No. 62/954,532, filed on Dec. 29, 2019.

(51) Int. Cl.
| | |
|---|---|
| *H10D 30/62* | (2025.01) |
| *H10D 84/01* | (2026.01) |
| *H10D 84/03* | (2025.01) |
| *H10D 84/83* | (2025.01) |

(52) U.S. Cl.
CPC ....... *H10D 84/013* (2025.01); *H10D 84/0149* (2025.01); *H10D 84/0158* (2025.01); *H10D 84/038* (2025.01); *H10D 84/834* (2025.01)

(58) Field of Classification Search
CPC .......... H10D 84/0193; H10D 83/0149; H10D 84/013; H10D 84/0186; H01L 23/5286
USPC ........................................................ 438/300
See application file for complete search history.

(56) References Cited

U.S. PATENT DOCUMENTS

| | | | |
|---|---|---|---|
| 6,838,332 B1 | 1/2005 | Sanchez et al. | |
| 7,402,866 B2 | 7/2008 | Liang et al. | |
| 8,373,228 B2 | 2/2013 | Yang et al. | |
| 8,647,953 B2 * | 2/2014 | Liao ..................... | H10D 62/405 |
| | | | 438/300 |
| 9,530,796 B2 * | 12/2016 | Stuber .................. | H10D 86/201 |
| 9,780,210 B1 * | 10/2017 | Goktepeli ............ | H10D 62/832 |
| 10,020,261 B2 | 7/2018 | Wu et al. | |
| 10,269,715 B2 | 4/2019 | Wu et al. | |
| 10,282,504 B2 | 5/2019 | Wu et al. | |
| 10,998,413 B2 | 5/2021 | Hiblot et al. | |
| 11,532,556 B2 * | 12/2022 | Huang .................. | H10D 30/62 |

| | | | |
|---|---|---|---|
| 2002/0011612 A1 * | 1/2002 | Hieda .................. | H10B 12/033 |
| | | | 257/E21.654 |
| 2002/0020862 A1 * | 2/2002 | Livengood ........ | H01L 21/76898 |
| | | | 257/E21.597 |
| 2007/0296002 A1 * | 12/2007 | Liang .................. | H10D 86/201 |
| | | | 257/288 |
| 2008/0054313 A1 * | 3/2008 | Dyer ................ | H01L 21/76898 |
| | | | 257/E21.597 |
| 2010/0276761 A1 | 11/2010 | Tung et al. | |
| 2011/0241073 A1 | 10/2011 | Cohen et al. | |
| 2015/0021688 A1 * | 1/2015 | Sung .................. | H10D 30/0227 |
| | | | 438/300 |
| 2020/0194567 A1 | 6/2020 | Hiblot et al. | |
| 2020/0381300 A1 | 12/2020 | Zhang et al. | |
| 2021/0202385 A1 | 7/2021 | Huang et al. | |
| 2021/0305252 A1 | 9/2021 | Chiang et al. | |
| 2021/0305262 A1 | 9/2021 | Wang et al. | |
| 2021/0305381 A1 | 9/2021 | Chiang et al. | |
| 2021/0305428 A1 | 9/2021 | Ju et al. | |
| 2021/0335709 A1 | 10/2021 | Wang et al. | |
| 2021/0351303 A1 | 11/2021 | Ju et al. | |
| 2021/0375691 A1 | 12/2021 | Chen et al. | |
| 2021/0376071 A1 | 12/2021 | Liu et al. | |
| 2021/0391421 A1 | 12/2021 | Chu et al. | |

FOREIGN PATENT DOCUMENTS

| | | | | |
|---|---|---|---|---|
| CN | 104867862 A | 8/2015 | | |
| CN | 106206435 A | 12/2016 | | |
| CN | 110556374 A | 12/2019 | | |
| CN | 113161419 | 7/2021 | | |
| CN | 113745184 | 12/2021 | | |
| DE | 102020122151 | 10/2021 | | |
| DE | 102020124124 | 12/2021 | | |
| EP | 3 667 733 A1 | 6/2020 | | |
| KR | 10-2016-0134442 | * 11/2016 | .......... | H10D 30/795 |
| KR | 20180110656 A | 10/2018 | | |
| KR | 20220016445 | 2/2022 | | |

* cited by examiner

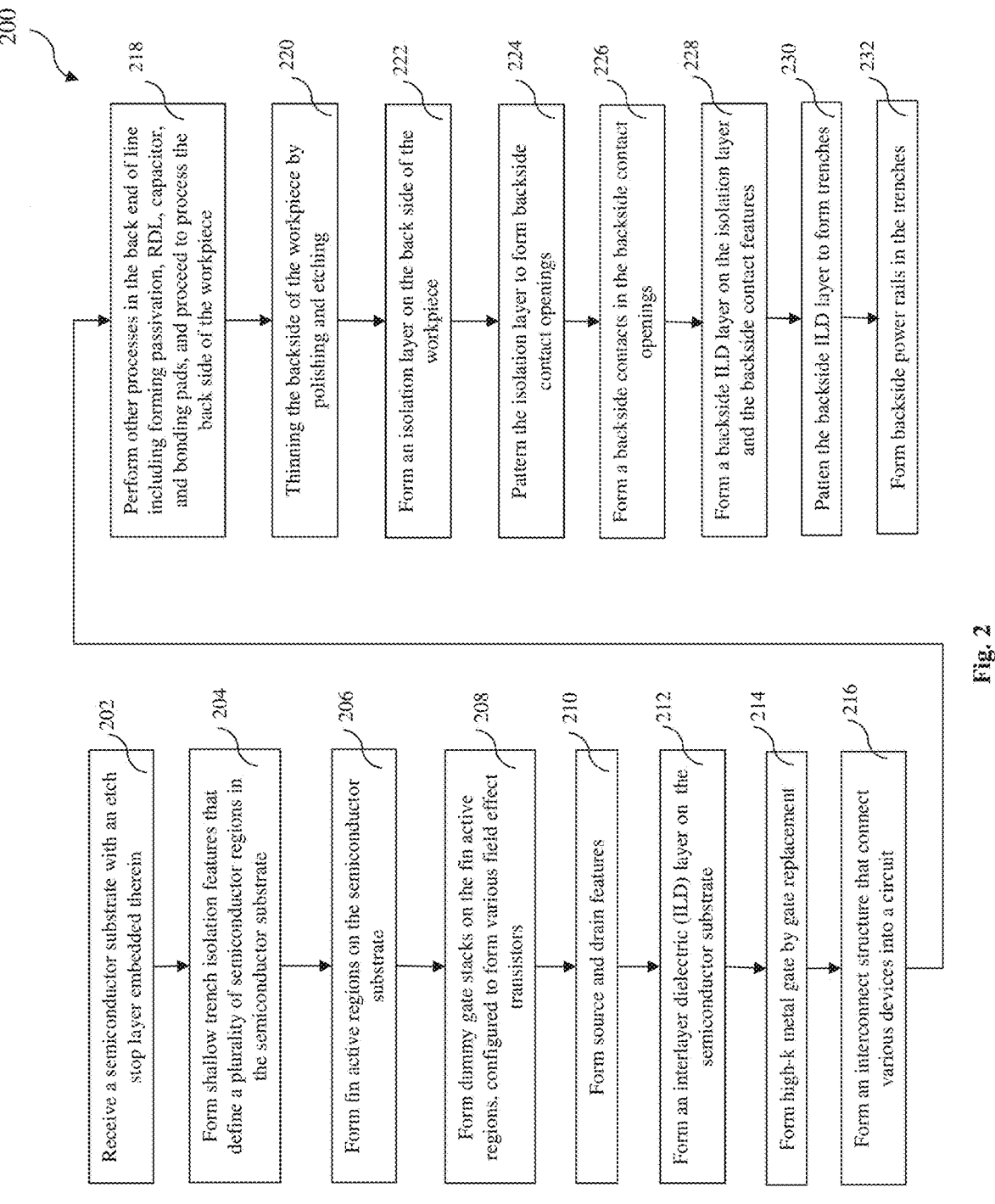

200

218 — Perform other processes in the back end of line including forming passivation, RDL, capacitor, and bonding pads, and proceed to process the back side of the workpiece 220 — Thinning the backside of the workpiece by polishing and etching 222 — Form an isolation layer on the back side of the workpiece 224 — Pattern the isolation layer to form backside contact openings 226 — Form a backside contacts in the backside contact openings 228 — Form a backside ILD layer on the isolation layer and the backside contact features 230 — Patten the backside ILD layer to form trenches 232 — Form backside power rails in the trenches 202 — Receive a semiconductor substrate with an etch stop layer embedded therein 204 — Form shallow trench isolation features that define a plurality of semiconductor regions in the semiconductor substrate 206 — Form fin active regions on the semiconductor substrate 208 — Form dummy gate stacks on the fin active regions, configured to form various field effect transistors 210 — Form source and drain features 212 — Form an interlayer dielectric (ILD) layer on the semiconductor substrate 214 — Form high-k metal gate by gate replacement 216 — Form an interconnect structure that connect various devices into a circuit

STRUCTURE AND METHOD FOR TRANSISTORS HAVING BACKSIDE POWER RAILS

PRIORITY DATA

This application is a divisional application of U.S. application Ser. No. 16/947,390, filed Jul. 30, 2020, which claims the benefit of U.S. Provisional Application 62/954,532 entitled "Structure and Method for Transistors with Backside Power Rails," filed Dec. 29, 2019, each of which is herein incorporated by reference in its entirety.

BACKGROUND

Integrated circuits have progressed to advanced technologies with smaller feature sizes, such as 7 nm, 5 nm and 3 nm. In these advanced technologies, the gate pitch (spacing) continuously shrinks and therefore induces contact to gate bridge concern. Furthermore, three dimensional transistors with fin-type active regions are often desired for enhanced device performance. Those three-dimensional field effect transistors (FETs) formed on fin-type active regions are also referred to as FinFETs. FinFETs are required narrow fin width for short channel control, which leads to smaller source/drain regions than those of planar FETs. This will reduce the alignment margins and cause issues for further shrinking device pitches and increasing packing density. Along with the scaling down of the device sizes, power lines are formed on the backside of the substrate. However, the existing backside power rails still face various challenges including routing resistance, alignment margins, layout flexibility, and packing density. Therefore, there is a need for a structure and method for fin transistors and power rails to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a flowchart of a method making the semiconductor structure of FIGS. 1A-1F constructed according to various aspects of the present disclosure in some embodiments.

DETAILED DESCRIPTION

Figure 1A:
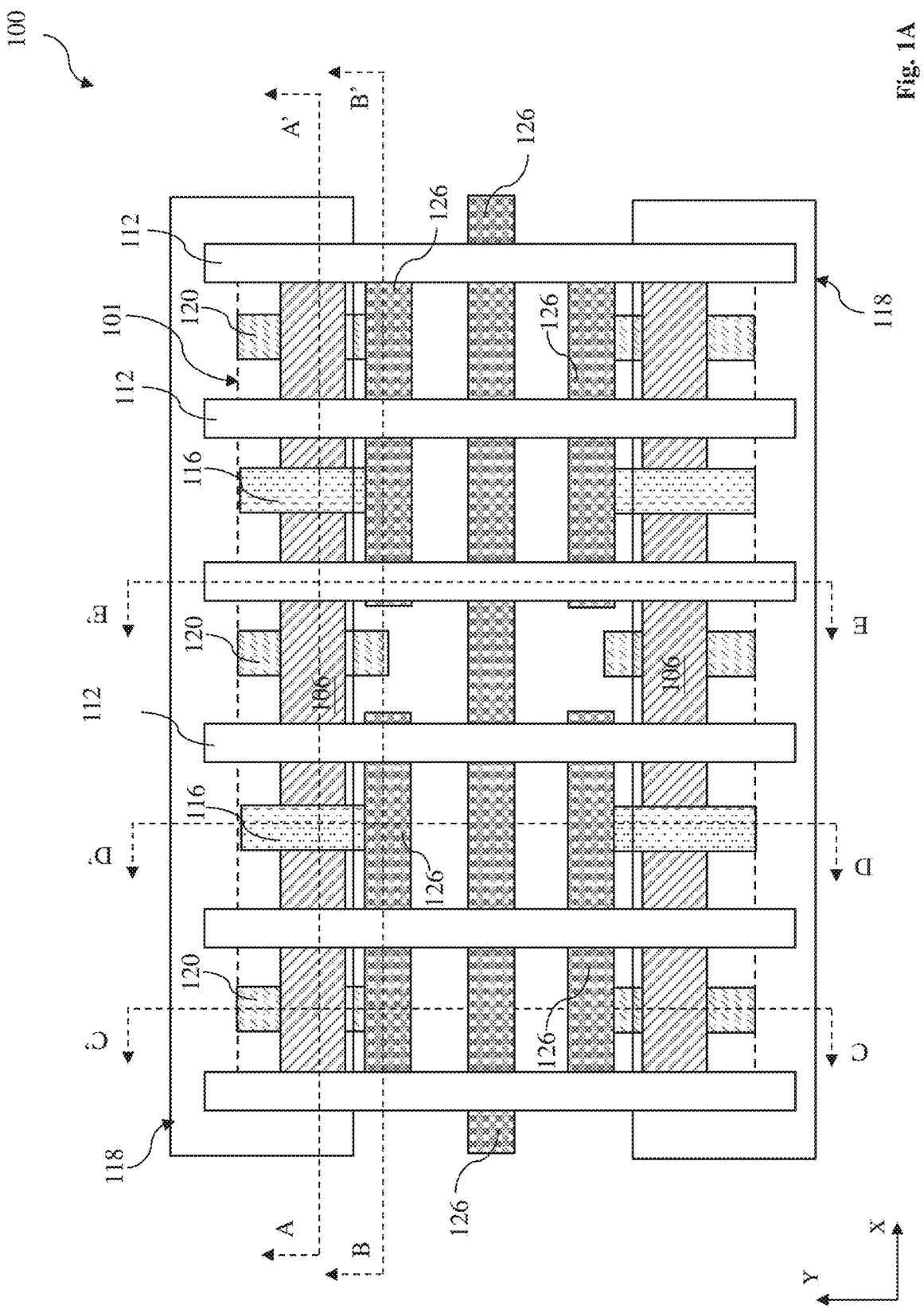
FIG. 1A is a top view of a semiconductor structure constructed according to some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact and may also include embodiments in which additional features may be formed interposing the first and second features, such that the first and second features may not be in direct contact.

The present disclosure provides a semiconductor structure with backside power rails and the method of making the same. Especially, the semiconductor structure includes a backside contact feature disposed on the back side of the substrate and interposed between the active regions and the backside power rails. The backside contact features electrically connect the backside power rails to the active regions, such as connecting a backside power rail to a source feature of a transistor. The semiconductor structure also includes an interconnect structure formed on the front side of the substrate. The interconnect structure further includes a front contact feature electrically connects to the field-effect transistors, such as landing on and connecting to a drain feature of a transistor. In the present embodiments, both front and backside contact features include silicide to reduce contact resistance. Such formed semiconductor structure includes backside power rails on the back side and the interconnect structure on the front side to collectively route power lines, such as the drain features being connected to the corresponding power lines through the interconnect structure and source features being connected to the corresponding power lines through the backside power rails.

FIG. 1A is a top view of a semiconductor structure 100 constructed according to some embodiments. FIGS. 1B, 1C, 1D, 1E and 1F are sectional views of the semiconductor structure 100 along the dashed lines AA', BB', CC', DD', and EE' respectively, constructed according to some embodiments. The semiconductor structure 100 may include one or more standard cell 101, each having one or more field-effect transistors.

The semiconductor structure 100 includes a substrate 102, active regions 106, and shallow trench isolation (STI) features 104 isolate the active regions from each other. In the present embodiment, the active regions 106 are fin active regions extruded above the STI features 104. In some embodiments, the active regions 106 may be alternatively planar active regions or active regions with multiple channels vertically stacked (also referred to gate-all-around (GAA) structure). The semiconductor structure 100 also includes sources (or referred to as source features) 108, drains (or referred to as drain features) 110, and gate stacks 112 disposed on the active regions 106. The source features 108 and the drain features 110 are interposed by respective gate stacks 112 to form various field-effect transistors (FETs). In the present embodiment, the active regions 106 have elongated shape oriented along the first direction (X direction) and the gate stacks 112 have elongated shape oriented along the second direction (Y direction) that is orthogonal to the first direction.

The semiconductor structure 100 also includes an interconnect structure 114 formed on the front side 102FS of the substrate 102. The interconnect structure 114 includes various contact features 116, via features and metal lines to connect FETs and other devices into functional circuits. The interconnect structure 114 includes multiple metal layers each have a plurality of metal lines and via features to vertically interconnecting the metal lines in the adjacent metal layers, such as metal lines 126 in the first metal layer and via features 128 connecting the metal lines 126 to the front contact features. In the present embodiment, the contact features 116 are also referred to front contact features as being formed on the front side of the substrate 102. Especially, a subset of the front contact features 116 are landing on the drain features 110.

The semiconductor structure 100 includes backside power rails 118 and backside contact features 120 formed on the backside 102BS of the substrate 102. The backside contact features 120 are interposed between the active regions 106 and the backside power rails 118, and electrically connect the backside power rails 118 to the active regions 106, such as connecting backside power rails 118 to source features 108 according to the present embodiment. Thus, both backside power rails on the back side and the interconnect structure on the front side collectively contribute to routing of the power lines, such as the drain features being connected to the corresponding power lines through the interconnect structure and source features being connected to the corresponding power lines through the backside power rails.

Figure 1B:
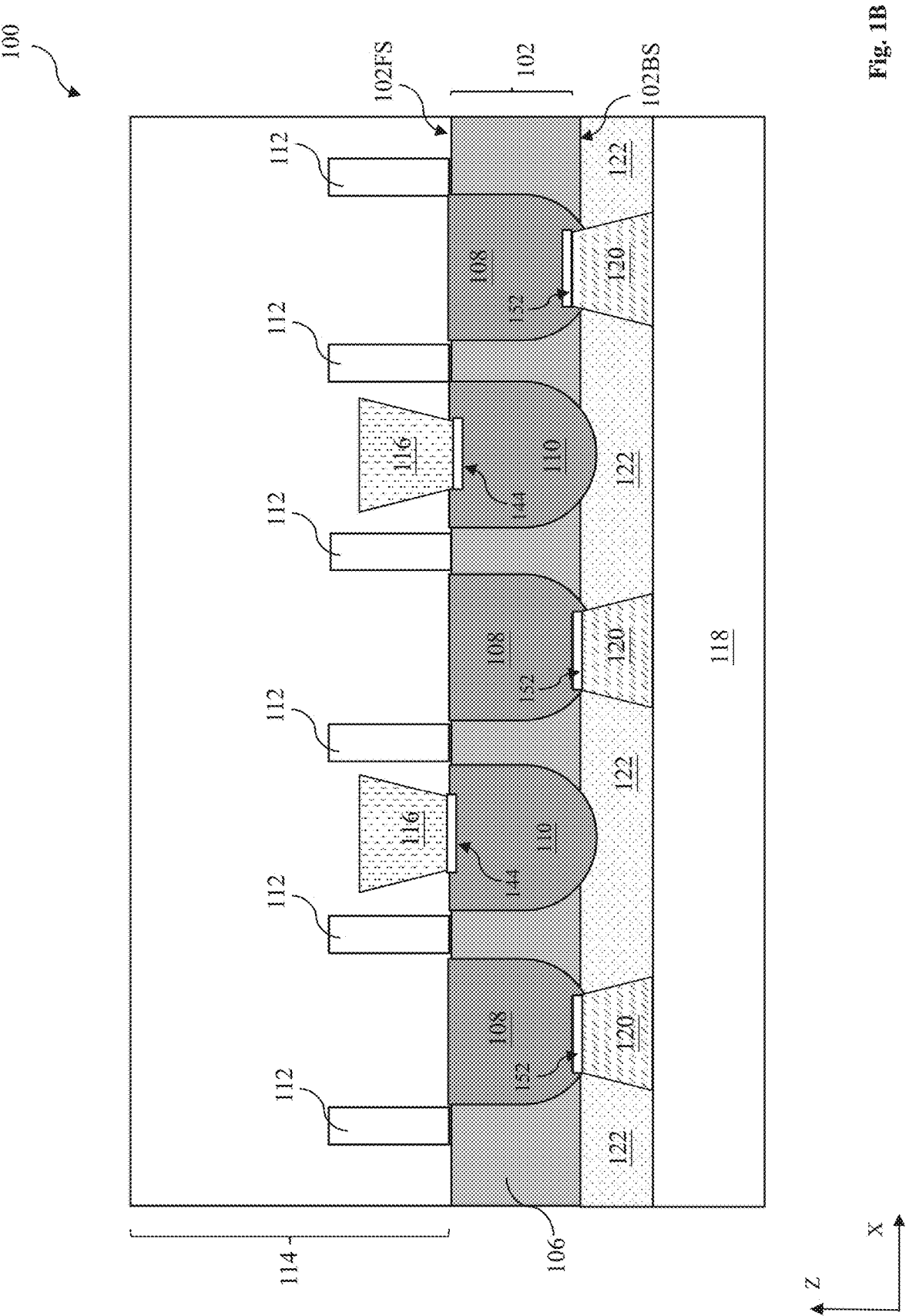
FIGS. 1B, 1C, 1D, 1E and 1F are sectional views of the semiconductor structure constructed according to some embodiments.

In the present embodiments, both front contact features 116 and backside contact features 120 include silicide and bulk metal on silicide to reduce contact resistance. Silicide includes titanium silicon (TiSi), nickel silicon (NiSi), tantalum silicon (TaSi), cobalt silicon (CoSi), or a combination thereof. In the present embodiment, a silicide layer 144 is formed on the drain feature 110 from the front side and is inserted between the drain feature 110 and the front contact feature 116; and a silicide layer 152 is formed on the source feature 108 from the back side and is inserted between the source feature 108 and the backside contact feature 120, as illustrated in FIG. 1B.

The semiconductor structure 100 further includes a dielectric layer 122 of a first dielectric material and a backside interlayer dielectric (BILD) layer 124 of a second dielectric material formed the backside of the substrate 102. The first and second dielectric materials are different in composition to provide etch selectivity. For examples, the first dielectric material includes silicon nitride, silicon carbon nitride, SiOCN, silicon oxide, SiOC or a combination thereof. The second dielectric material includes one of the above dielectric material but is chosen to be different from the first dielectric material in composition to provide etch selectivity.

FIG. 2 is a flowchart of a method 200 making the semiconductor structure 100 in accordance with some embodiments. The method 200 includes various operations 202 through 232 to form the semiconductor structure 100 in FIGS. 1A-1F. Especially, the method 200 includes forming FETs (and other devices) and the interconnect structure 114 on the front side of the substrate 102 and forming backside power rails 118 and backside contact features 120 on the backside of the substrate 102 in which power lines are collectively routed through the backside power rails 118 on the back side and the interconnect structure 114 on the front side of the substrate 102.

Especially, the method 200 includes an operation 220 to thin down the substrate 102 from the backside. The operation 220 may include grinding, chemical mechanical polishing (CMP) and etch such as wet etch in a combination to make thinning process efficient. To have the thinning process properly stop, the substrate 102 includes an embedded layer, such as a silicon germanium layer or a doped silicon germanium layer to provide etch selectivity during the thinning process so that the thinning process of the operation 220 can stop properly. In the present embodiment, the substrate 102 is a silicon substrate. A silicon germanium layer is epitaxially grown on the silicon surface, and then a silicon layer is epitaxially grown on the doped silicon germanium surface. The silicon germanium functions as an etch stop layer during the etch process. In other embodiments, the etch stop layer can be other semiconductor material different from silicon, such as a compound semiconductor material, a silicon layer doped with other elements for enhanced etch selectivity, or other semiconductor layer doped or undoped, such as silicon carbide.

FIGS. 3 through 18 are top or sectional views of a semiconductor structure (or workpiece) 300 at various fabrication stages. The semiconductor structure 300 is one example of the semiconductor structure 100 or an alternative structure constructed in accordance with some embodiments. The semiconductor structure 300 includes field-effect transistors (FETs), interconnect structure and backside power rails. The semiconductor structure 300 (so the semiconductor structure 100 as well) and the method 200 making the same are collectively described below with reference to FIGS. 1 through 18.

Figure 3:
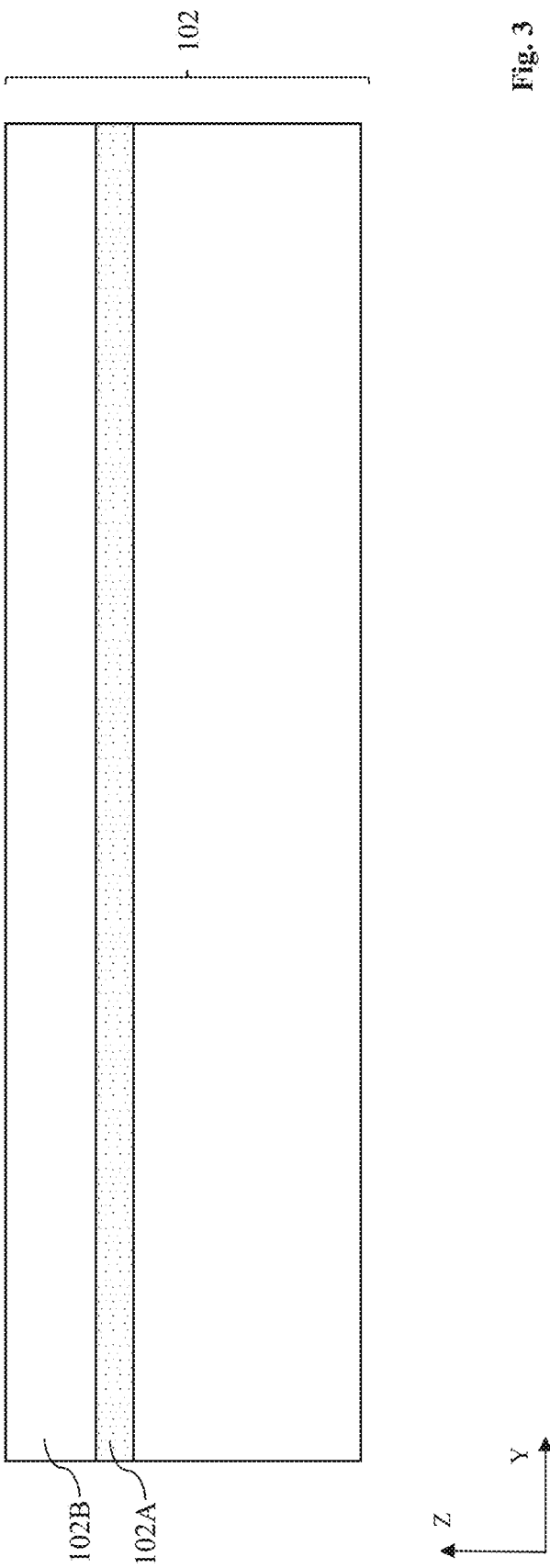
FIGS. 3, 4, 5A, 6A, 6C, 7, 8, 9, 11, 12, 13, 14, 15, 16, 17, 18 and 19 are sectional views of a semiconductor structure at various fabrication stages constructed according to some embodiments.

Referring to FIGS. 2 and 3, the method 200 begins with block 202 by receiving a workpiece (or a semiconductor structure) 300 having a semiconductor substrate 102. The semiconductor substrate 102 includes silicon. In some other embodiments, the substrate 102 includes germanium, silicon germanium or other proper semiconductor materials. The substrate 102 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor substrate 102 also includes various doped regions such as n-well and p-wells. In one embodiment, the semiconductor substrate 102 includes an epitaxy (or epi) semiconductor layer. In another embodiment, the semiconductor substrate 102 includes a buried dielectric material layer for isolation formed by a proper technology, such as a technology referred to as separation by implanted oxygen (SIMOX). In some embodiments, the substrate 102 may be a semiconductor on insulator, such as silicon on insulator (SOI). Especially, the substrate 102 includes a semiconductor layer 102A functioning as an etch stop layer (ESL) for later fabrication associated with backside power rails. The semiconductor layer 102A is embedded in the semiconductor substrate 102 but includes a different semiconductor composition to provide etch selectivity during the backside processes. For example, the semiconductor layer 102A is a silicon germanium ($Si_xGe_y$) layer while the bulk substrate is a silicon substrate. The etch selectivity can be tuned through the concentration of germanium in the silicon germanium layer 102A. Germanium concentration (atomic percentage) in the silicon germanium layer may range between 30% and 90%. The semiconductor layer 102A may be undoped or doped with suitable dopant (such as boron, phosphorous, carbon or a combination thereof) to further enhance the etch selectivity. In one example, an etch solution of $NH_4OH$, $H_2O_2$ and $H_2O$ may be used to selectively etch silicon germanium relative to silicon with significant etch selectivity.

The semiconductor layer 102A can be formed by epitaxial growth, such as epitaxially growing a silicon germanium layer 102A on a silicon substrate and thereafter epitaxially growing a silicon layer 102B on the silicon germanium layer 102A. In some embodiments, the semiconductor layer 102A has a thickness ranging between 10 nm and 20 nm while the silicon layer 102B has a thickness ranging between 70 nm and 100 nm.

Figure 4:

Referring to FIGS. 2 and 4, the method 200 proceeds to an operation 204 by forming isolation features, such as shallow trench isolation (STI) features 104 on the semiconductor substrate 102, thereby defining active regions 106 separated and isolated from each other by the isolation features. In FIG. 4 and some following figures, the embedded semiconductor layer 102A is not illustrated for simplicity but it is understood that the semiconductor layer 102A is present as a part of the semiconductor substrate 102.

In some embodiments, the STI features 104 are formed by a procedure that includes etching to form trenches, filling the trenches with dielectric material, and polishing to remove the excessive dielectric material and to planarize the top surface. One or more etching processes are performed on the semiconductor substrate 102 through openings of soft mask or hard mask, which are formed by lithography patterning and etching. The formation of the STI features 104 are further described below in accordance with some embodiments.

In the present example, a hard mask is deposited on the substrate 102 and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) is formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer during a developing process. This procedure to form a patterned resist layer is also referred to as lithographic process (or lithography patterning process). An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less photolithography, electron-beam writing, and ion-beam writing.

After patterning the resist, an etching process is performed on the semiconductor structure 300 to open the hard mask layer, thereby transferring the pattern from the resist layer to the hard mask layer. The remaining resist layer may be removed after patterning the hard mask layer. The etching process to pattern the hard mask layer may include wet etching, dry etching or a combination thereof. The etching process may include multiple etching steps. For example, the silicon oxide film in the hard mask layer may be etched by a diluted hydrofluoric acid solution and the silicon nitride film in the hard mask layer may be etched by a phosphoric acid solution.

Then another etching process may be followed to etch the portions of the substrate 102 not covered by the patterned hard mask layer to form trenches in the semiconductor substrate 102. The patterned hard mask layer is used as an etch mask during the etching process to pattern the substrate 102. The etching process may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 102 is partially etched.

One or more dielectric material is filled in the trenches to form the STI features 104. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure 300. The CMP process may use the hard mask layers as a polishing stop layer to prevent polishing the semiconductor surface. The hard mask may be removed by the CMP process or alternatively by an etching process.

Figure 5A:
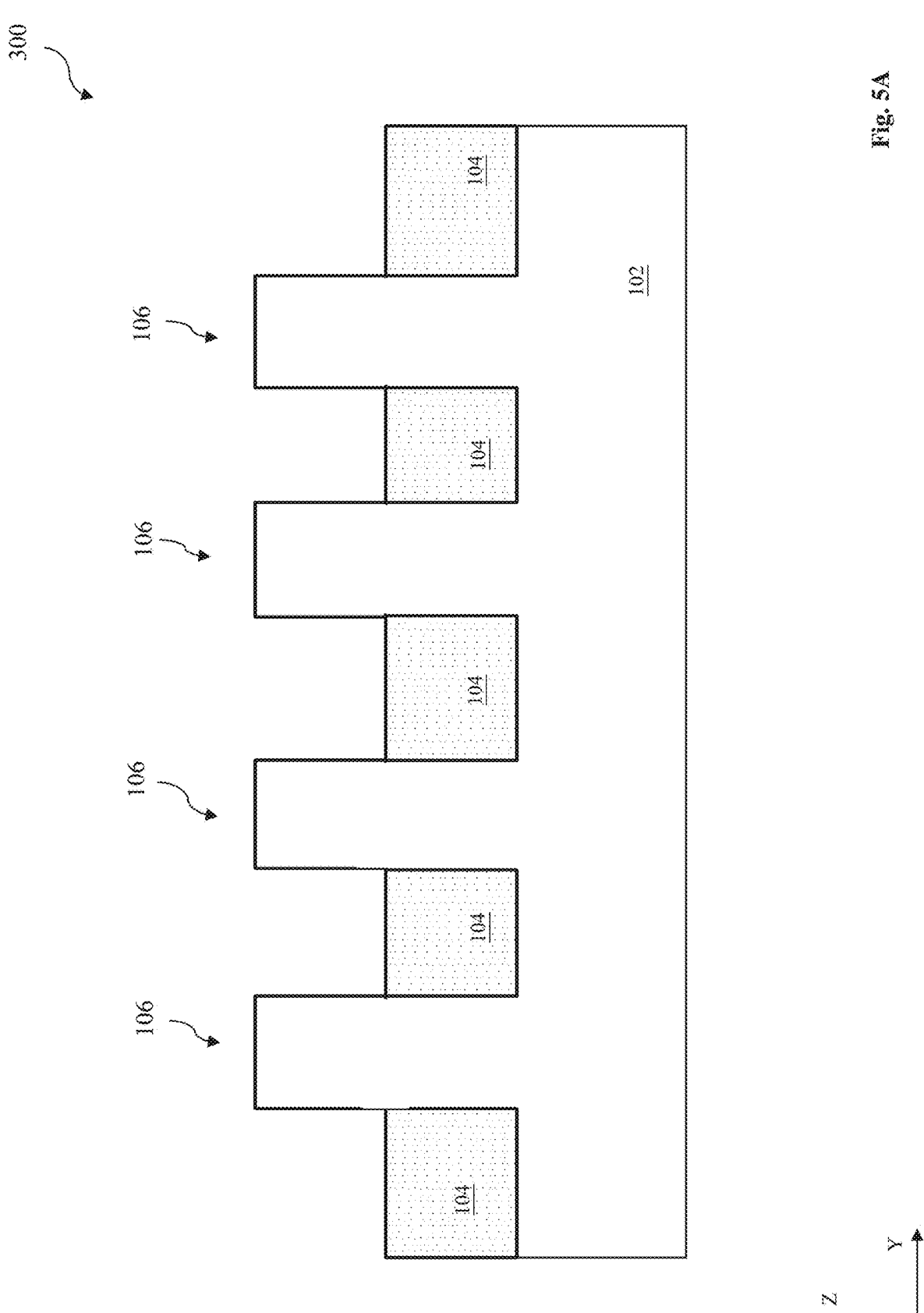
Figure 5B:
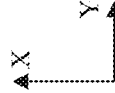
FIGS. 5B and 6B are top views of a semiconductor structure at various fabrication stages constructed according to some embodiments.

Referring to FIGS. 5A and 5B, the method 200 may proceed to an operation 206 by forming the fin structure having multiple fin active regions (or fin features) 106. FIGS. 5A and 5B are a sectional view and a top view, respectively, of the semiconductor structure 300. The operation 206 includes recessing the STI features 104 such that the active regions 106 are extruded above from the STI features 104, therefore being referred to as fin active regions. The recessing process employs one or more etching steps (such as dry etch, wet etch or a combination thereof) to selectively etch back the STI features 104. For example, hydrofluoric acid may be applied a wet etching process using to selective etch the STI features 104 when the STI features 104 are silicon oxide features. Exemplary fin active regions 106 are spaced from each other in the second direction (Y direction). The fin active regions 106 have elongated shape oriented along the first direction (X direction).

Doping processes may be applied to the fin active regions 106 to form various doped wells in the semiconductor substrate 102, such as n-wells and p-wells at the present stage or before the operation 206. Various doped wells may be formed by respective ion implantations or diffusions.

Figure 6A:
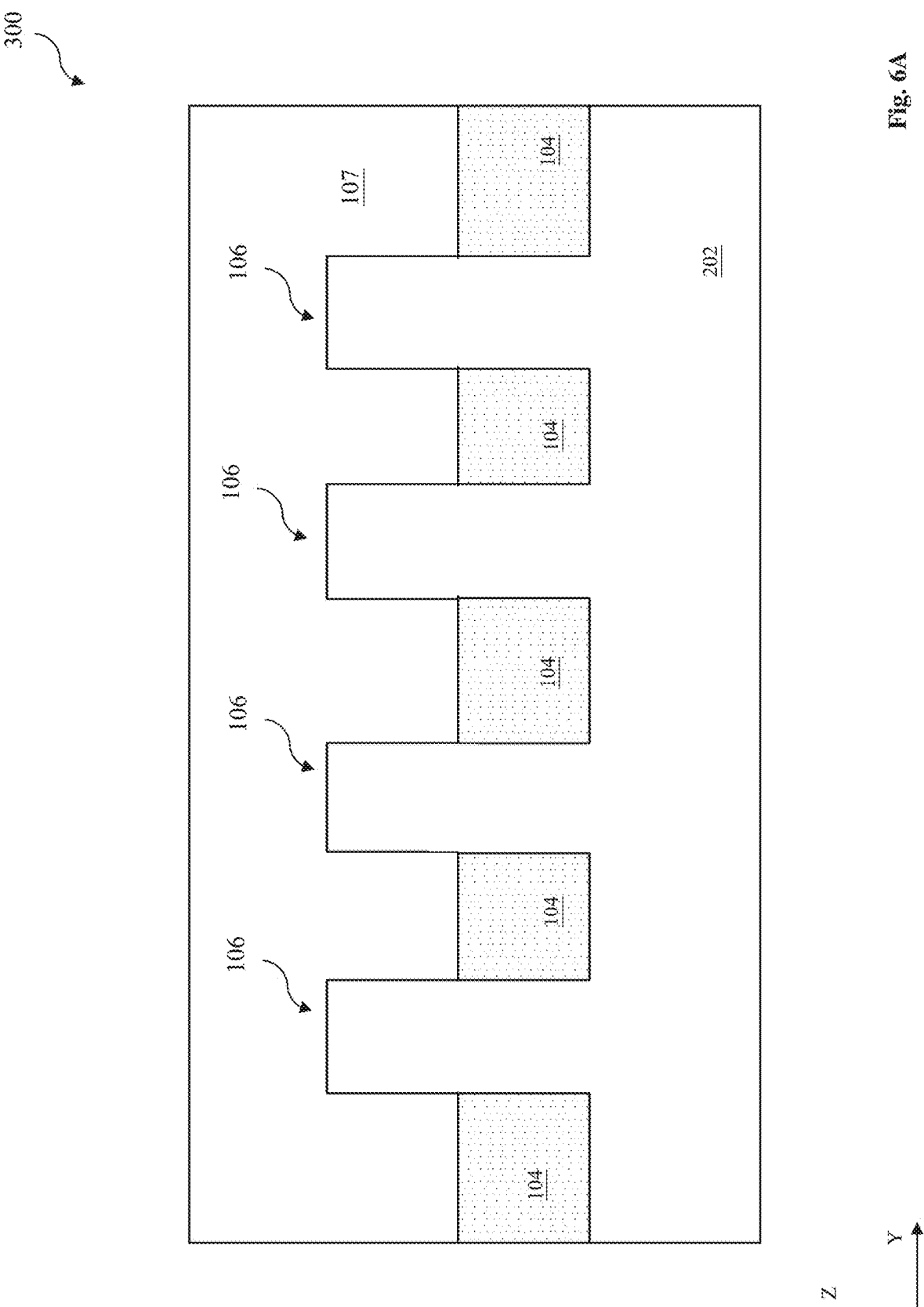
Figure 6B:
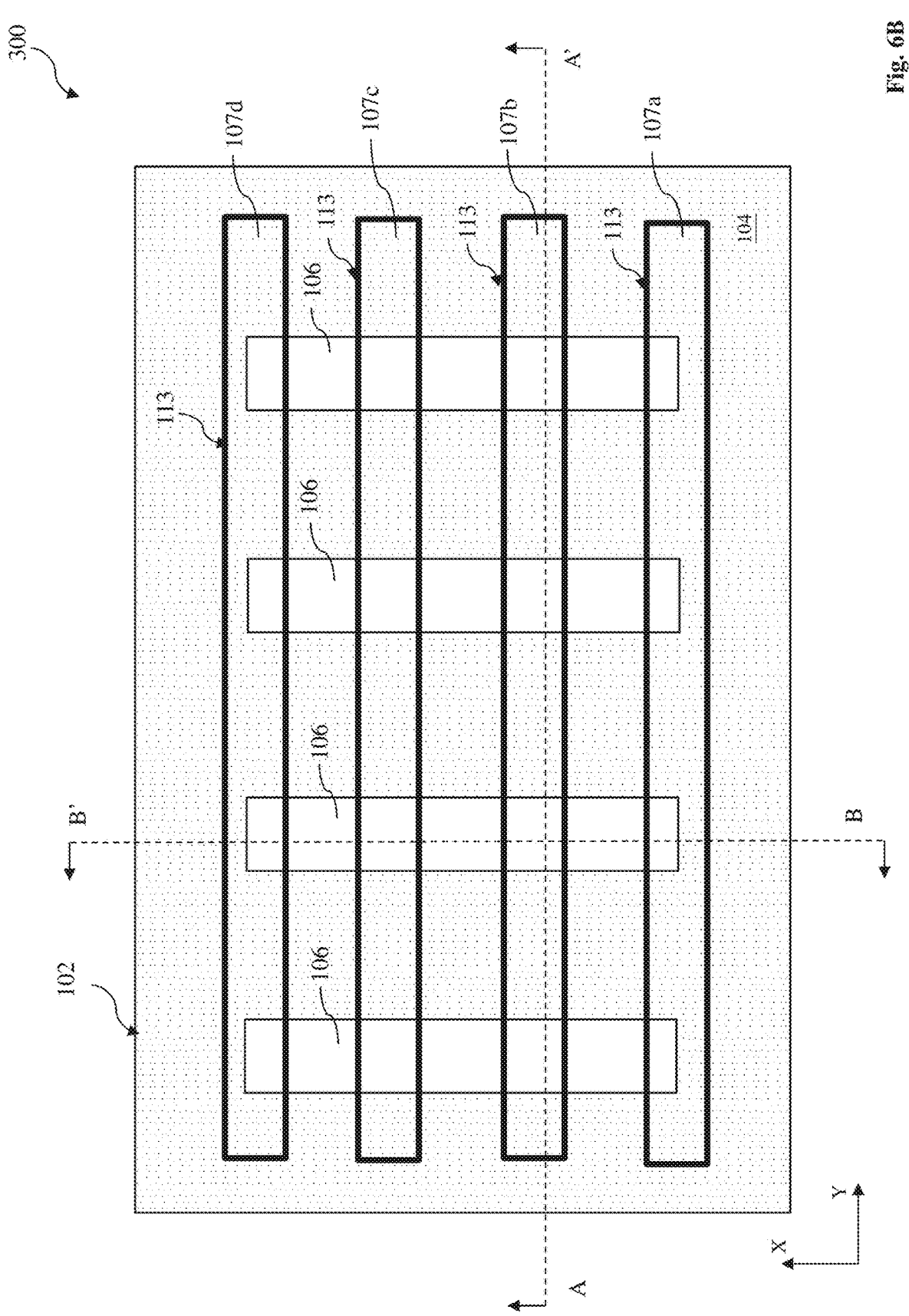
Figure 6C:
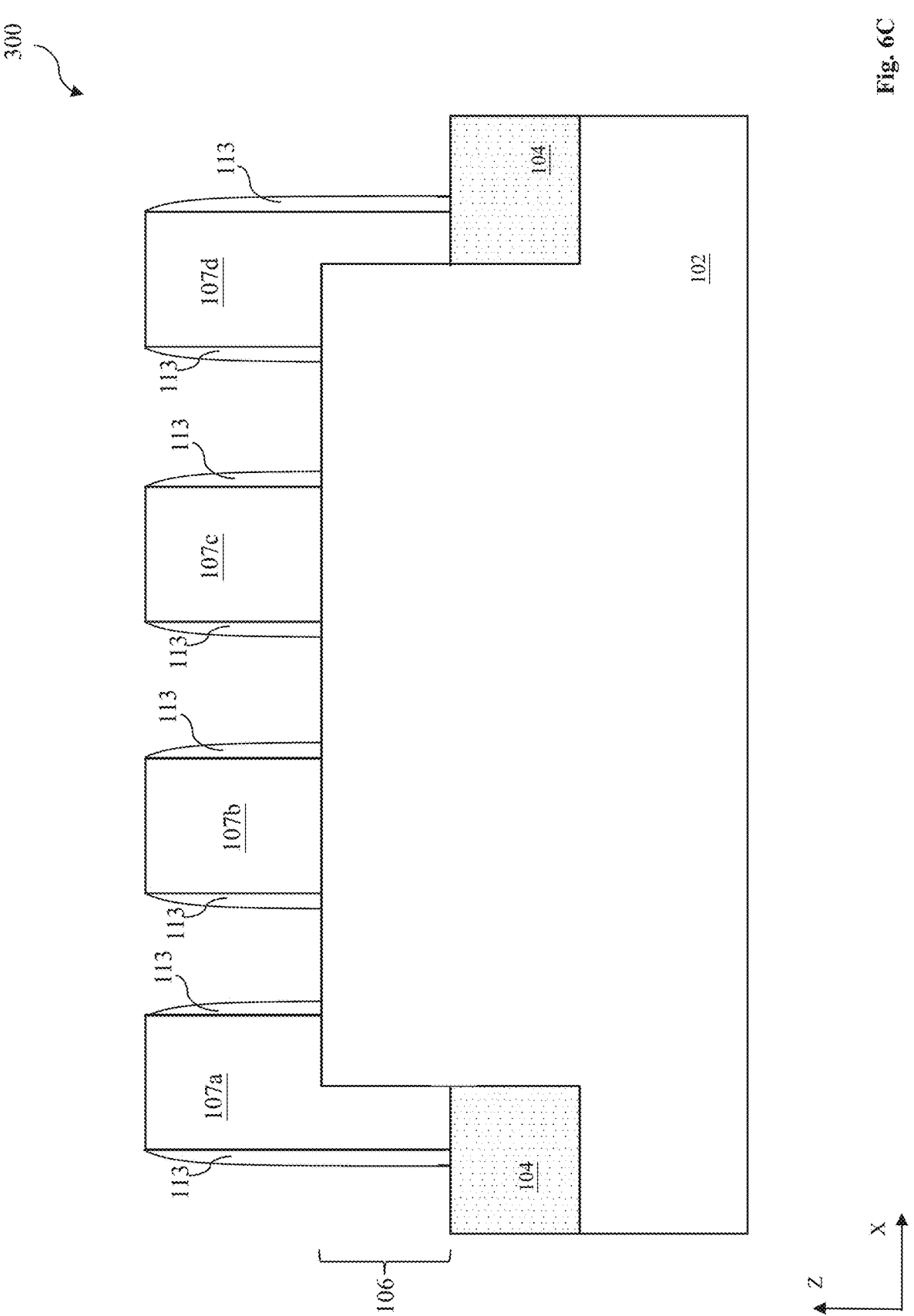

Referring to FIGS. 6A, 6B and 6C, the method 200 proceeds to an operation 208 by forming various gate stacks 107 on the fin active regions 106. FIG. 6B is a top view; FIG. 6A is a sectional view along the dashed line AA'; and FIG. 6C is a sectional view along the dashed line BB' of the semiconductor structure 300. In the present embodiment, the gate stacks 107 include exemplary gate stacks 107a, 107b, 107c and 107d, as illustrated in FIG. 6B. The following FIGS. 7~19 are all sectional views of the semiconductor structure 300 along the dashed line BB' of FIG. 6B but at later fabrication stages.

The gate stacks 107 have elongated shapes and are oriented in the second direction (Y direction). Each of the gate stacks 107 is extended over multiple fin active regions 106. Particularly, one gate stack 107 (such as gate stack 107*a* or 107*d*) is disposed on ends (or edges) of the fin active regions 106 so that this gate stack is partially landing on the fin active region 106 and partially landing on the STI feature 104. Those edge configuration is designed to reduce boundary effect, increase the device uniformity and improve overall device performance.

In the present embodiment, the gate stacks 107 are dummy gate stacks to be replaced by metal gates at later fabrication stages. The dummy gate stacks 107 each may include a gate dielectric layer and a gate electrode. The gate dielectric layer includes a dielectric material, such as silicon oxide, and the gate electrode may include polysilicon. The formation of the gate stacks 107 includes depositing the gate materials (including polysilicon in the present example); and patterning the gate materials by lithographic process and etching. A gate hard mask layer may be formed on the gate material layer and is used as an etch mask during the formation of the gate stacks. The gate hard mask layer may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the gate stacks 107 includes forming a patterned resist layer by lithography process; etching the hard mask layer using the patterned resist layer as an etch mask; and etching the gate materials to form the gate stacks 107 using the patterned hard mask as an etch mask.

One or more gate sidewall features (or gate spacers) 113 are formed on the sidewalls of the gate stacks 107. The gate spacers 113 may be used to offset the subsequently formed source/drain features, to design or modify the source/drain structure profile, and/or to provide isolation among the gate electrode and the source/drain features. The gate spacers 113 may include any suitable dielectric material, such as a semiconductor oxide, a semiconductor nitride, a semiconductor oxynitride, other suitable dielectric materials, and/or combinations thereof. The gate spacers 113 may have multiple films, such as dual films (e.g., a silicon oxide film and a silicon nitride film) or three films ((a silicon oxide film; a silicon nitride film; and a silicon oxide film). The formation of the gate spacers 113 includes deposition and anisotropic etching, such as dry etching.

Figure 7:
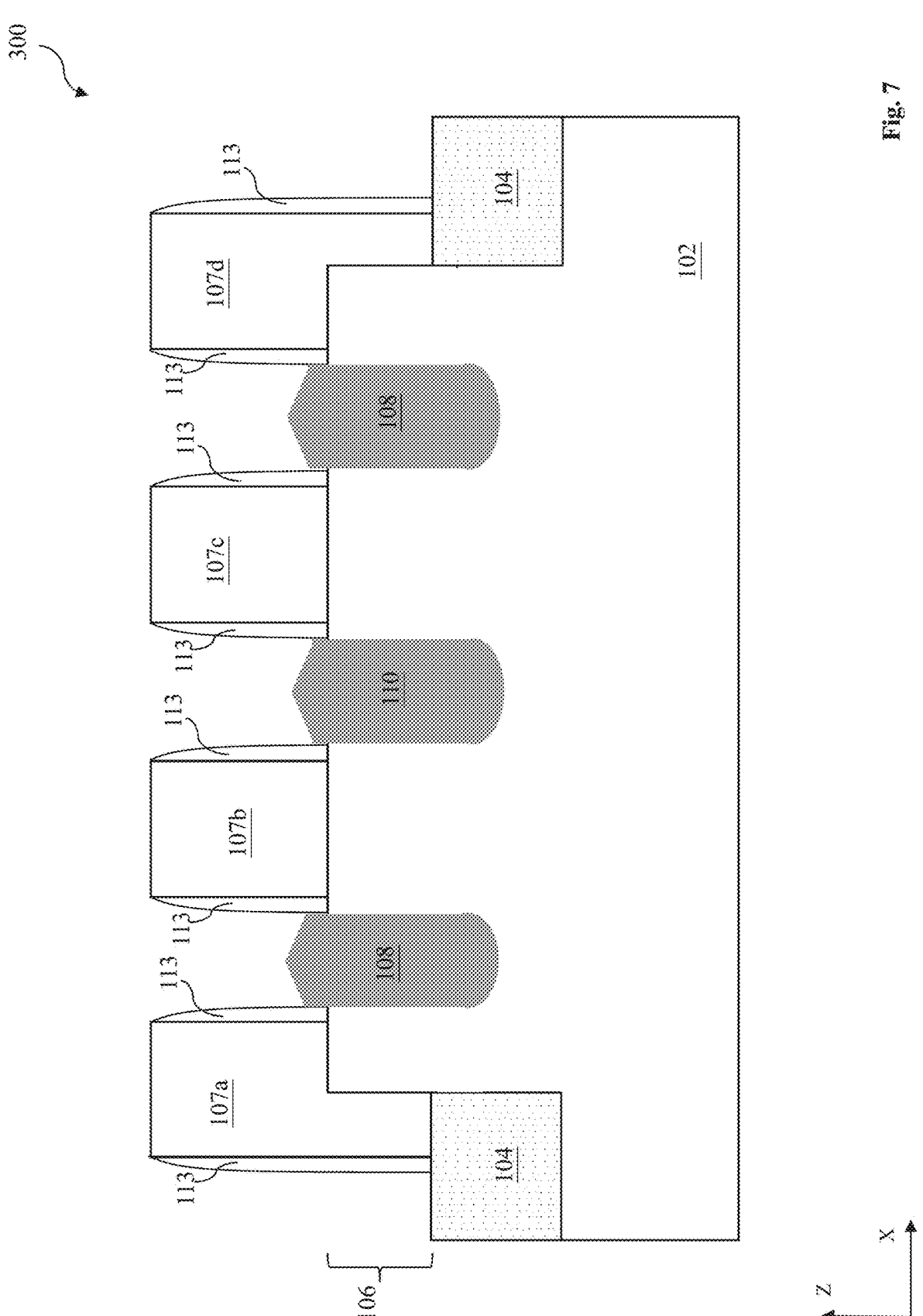

Referring to FIG. 7 in a sectional view, the method 200 proceeds to an operation 210 by forming various source features 108 and drain features 110 to respective fin FETs (FinFETs). The source features 108 and the drain features 110 may include both light doped drain (LDD) features and heavily doped source and drain (S/D). For example, each field-effect transistor includes a source feature 108 and a drain feature 110 formed on the respective fin feature 106 and interposed by the gate stack. A channel is formed in the fin feature 106 within a portion that is underlying the gate stack and spans between the source feature 108 and the drain feature 110.

The source/drain features 108 and 110 may have a raised source/drain structure and may be formed by selective epitaxy growth for strain effect with enhanced carrier mobility and device performance. The gate stacks 107 and gate spacer 113 constrain the source/drain features 108 and 110 to the source/drain regions. In some embodiments, the source/drain features 108 and 110 are formed by one or more epitaxy or epitaxial processes, whereby Si features, SiGe features, SiC features, and/or other suitable semiconductor features are grown in a crystalline state on the fin features 106. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin features 106.

The source/drain features 108 and 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features are not in-situ doped, an implantation process is performed to introduce the corresponding dopant into the source/drain features 108 and 110. In an exemplary embodiment, the source/drain features 108 and 110 in an nFET include Si or SiC doped with phosphorous, while the source/drain features 108 and 110 in a pFET include SiGe or Ge doped with boron. In some other embodiments, the source/drain features 108 and 110 include more than one semiconductor material layers. For example, a silicon germanium layer is epitaxially grown on the substrate within the source/drain regions and a silicon layer is epitaxially grown on the silicon germanium layer. In another example, a semiconductor (silicon germanium or silicon) layer is epitaxially grown with multiple films having different dopant concentrations on the substrate within the source/drain regions. One or more annealing processes may be performed thereafter to activate the source/drain features. Suitable annealing processes include rapid thermal annealing (RTA), laser annealing processes, other suitable annealing technique or a combination thereof.

Figure 8:
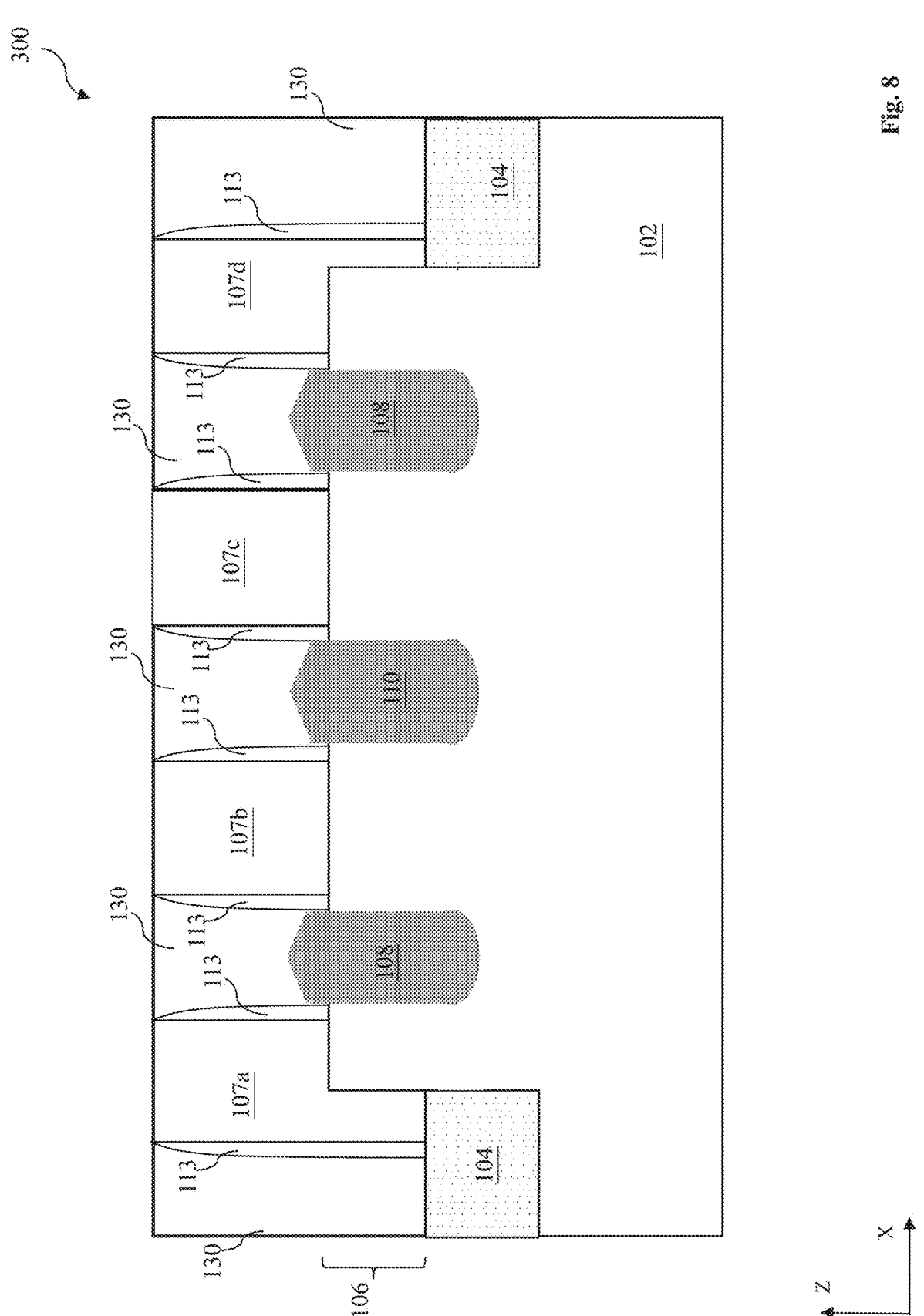

Referring to FIG. 8, the method 200 proceeds to an operation 212, in which an interlayer dielectric material (ILD) layer 130 (also referred to as front ILD layer or FILD layer to differentiate from the BILD 124) is formed on the substrate 102 to cover the source/drain features 108 and 110 from the front side. The ILD 130 surround the gate stacks 107 and the gate spacers 113 allowing the gate stacks 107 to be removed and replacement gates to be formed in the resulting cavities (also referred to as gate trenches). Accordingly, in such embodiments, the gate stacks 107 are removed after forming the ILD layer 130. The ILD layer 130 may also be part of an interconnect structure 114 that electrically interconnects various devices of the semiconductor structure 300. In such embodiments, the ILD layer 130 acts as an insulator that supports and isolates the conductive traces. The ILD layer 130 may include any suitable dielectric material, such as a semiconductor oxide, a semiconductor nitride, a semiconductor oxynitride, other suitable dielectric materials, or combinations thereof. In some embodiments, the formation of the ILD layer 130 includes deposition and CMP to provide a planarized top surface.

Figure 9:
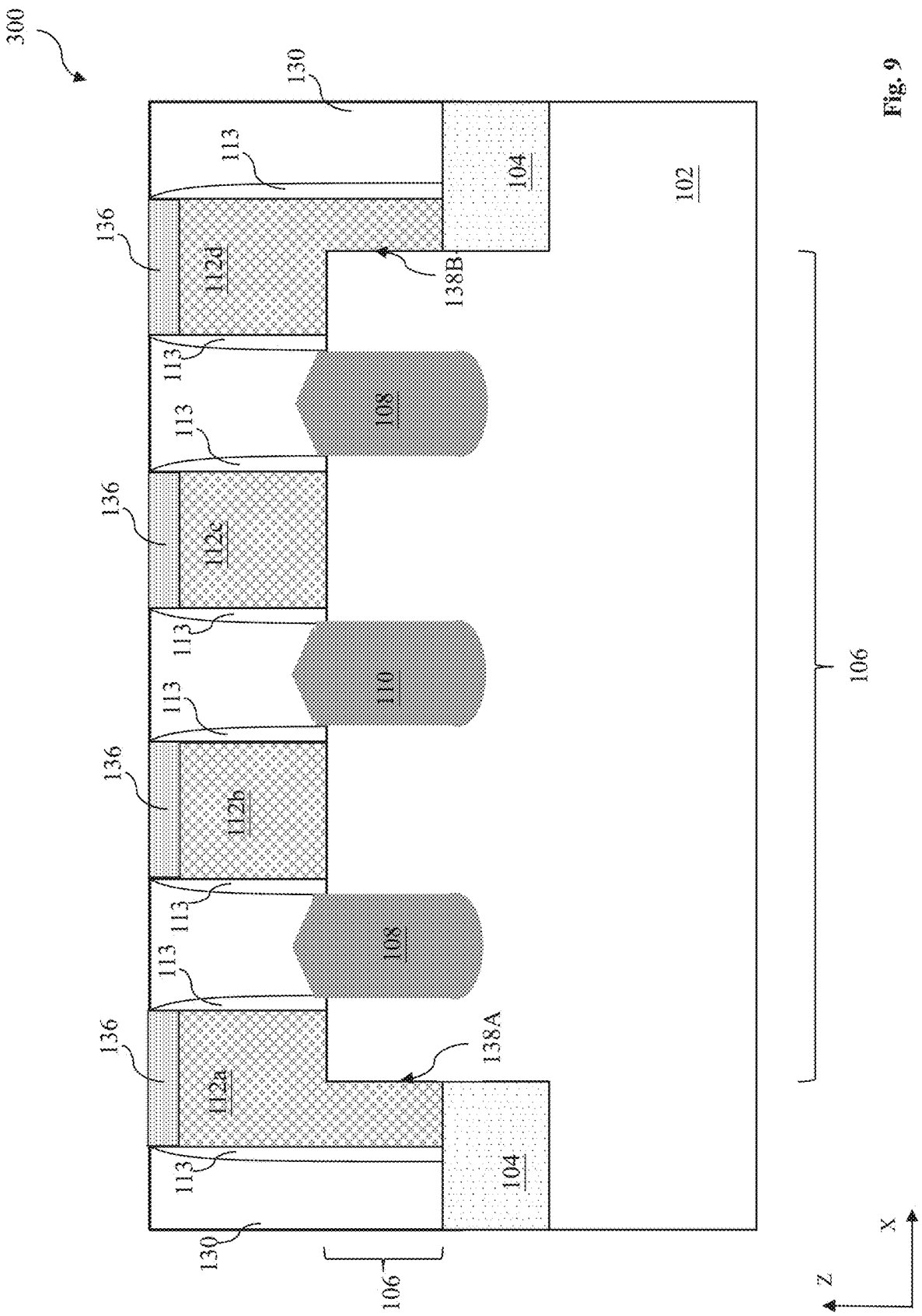

Referring to FIG. 9, the method 200 proceeds to an operation 214 for gate replacement. The dummy gate stacks 107 are replaced by gate stacks 112 having high k dielectric material and metal, therefore also referred to as high-k metal gates.

The gate stacks 112 are configured in the fin active regions 106 to form various field effect transistors (FETs), therefore also referred to as FinFETs. In some examples, the field effect transistors include n-type transistors and p-type transistors. In other examples, those field effect transistors are configured to form one or more static random-access memory (SRAM) cells, logic gate cells, or a structure having both. Each SRAM cell includes two cross-coupled inverters configured for data storage. Furthermore, the gate stacks 112 are configured to increase the pattern uniformity and enhance the fabrication quality. For example, as noted above, the gate stacks 112 includes edge gate stacks 112*a* and 112*d* each being extended from the fin features 106 to the STI features 104 along the Y direction and landing on both the STI features 104 and the fin features 106.

Figure 10B:
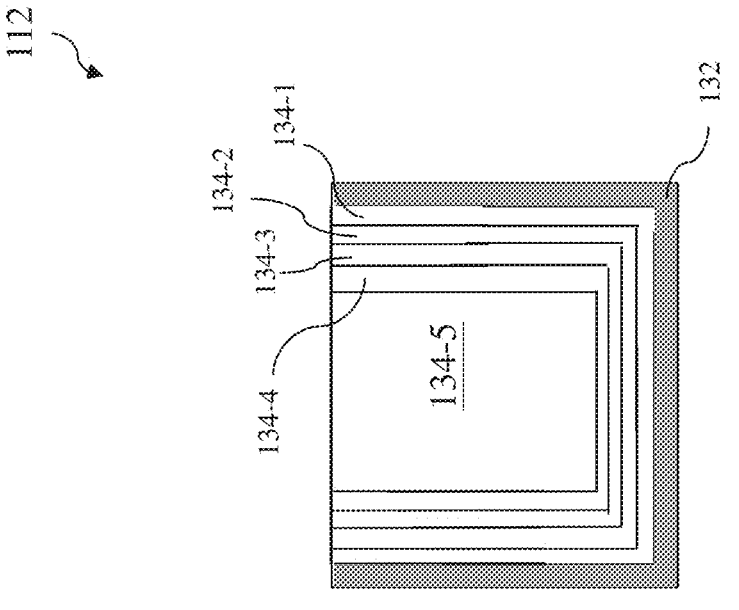
FIGS. 10A and 10B are sectional views of a gate stack of the semiconductor structure constructed according to some embodiments
Figure 10A:
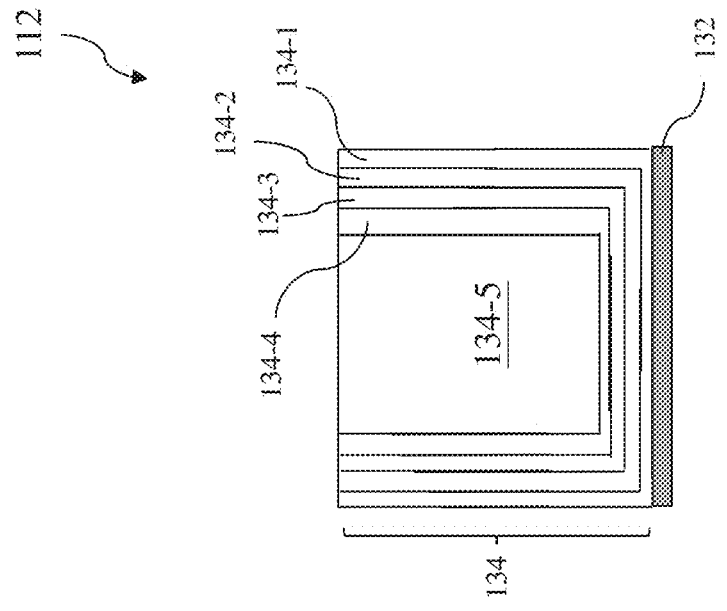

As illustrated in FIG. 9, the fin active regions 106 spans from one end 138A to another end 138B along the X direction. The gate replacement process may include etching, deposition and polishing. In the present example for illustration, exemplary dummy gate stacks 107*a*, 107*b*, 107*c* and 107*d* are removed, resulting in gate trenches. In some embodiments, the dummy gate stacks 107 are removed by an etching process, such as a wet etch to selectively remove the gate stacks 107. The etching process may include multiple etching steps to remove the dummy gate if more materials present. Then the gate materials, such as high k dielectric material and metal, are deposited in the gate trenches to form the gate stacks 112, such as exemplary gate stacks 112*a*, 112*b*, 112*c* and 112*d*. A CMP process is further implemented to polish and remove the excessive gate materials from the semiconductor structure 300. The structure and the formation of the gate stacks 112 are further described below with a reference to FIGS. 10A and 10B. FIGS. 10A and 10B illustrate sectional views of an exemplary gate stack 112 in accordance with various embodiments.

The gate stack 112 (such as 112*b*) is formed on the substrate 102 overlying the channel region of the fin active region 106. The gate stack 112 is formed in the gate trench by a proper procedure, such as a procedure that includes deposition and CMP. Although it is understood that the gate stack 112 may have other suitable gate structure and may be formed by other suitable procedure.

The gate stack 112 includes a gate dielectric layer (or gate dielectric feature) 132 and a gate electrode 134 disposed on the gate dielectric layer 132. In the present embodiment, the gate dielectric layer 132 includes high-k dielectric material and the gate electrode 134 includes metal or metal alloy. In some examples, the gate dielectric layer 132 and the gate electrode 134 each may include a number of sub-layers.

The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode 134 may include Ti, Ag, Al, TiAlN, TaC, TaCN, TaSiN, Mn, Zr, TiN, TaN, Ru, Mo, WN, Cu, W, or any suitable materials. In some embodiments, different metal materials are used for nFET and pFET devices with respective work functions.

The gate dielectric layer 132 may further includes an interfacial layer sandwiched between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some embodiments, the gate dielectric layer 132 is formed on the fin active region 106 at the operation 208 that forms the gate stack 107. In this case, the gate dielectric layer 132 is shaped as illustrated in FIG. 10A. In some other embodiments, the gate dielectric layer 132 is formed in the high-k last process, in which the gate dielectric layer 132 is deposited in the gate trench at the operation 214. In this case, the gate dielectric layer 132 is U-shaped, as illustrated in FIG. 10B.

The gate electrode 134 may include multiple conductive materials. In some embodiments, the gate electrode 134 includes a capping layer 134-1, a blocking layer 134-2, a work function metal layer 134-3, another blocking layer 134-4 and a filling metal layer 134-5. In furtherance of the embodiments, the capping layer 134-1 includes titanium nitride, tantalum nitride, or other suitable material, formed by a proper deposition technique such as ALD. The blocking layer 134-2 includes titanium nitride, tantalum nitride, or other suitable material, formed by a proper deposition technique such as ALD. In some examples, the block layers may not present or only one of them presents in the gate electrode.

The work functional metal layer 134-3 includes a conductive layer of metal or metal alloy with proper work function such that the corresponding FET is enhanced for its device performance. The work function (WF) metal layer 134-3 is different for a pFET and an nFET, respectively referred to as an n-type WF metal and a p-type WF metal. The choice of the WF metal depends on the FET to be formed on the active region. For example, the semiconductor structure 300 includes a first active region for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD or ALD.

The blocking layer 134-4 includes titanium nitride, tantalum nitride, or other suitable material, formed by a proper deposition technique such as ALD. In various embodiments, the filling metal layer 134-5 includes aluminum, tungsten or other suitable metal. The filling metal layer 134-5 is deposited by a suitable technique, such as PVD or plating.

Referring back to FIG. 9, the method 200 may also include an operation to form a hard mask 136 on top of the gate stacks 112 to protect the gate stacks 112 from loss during subsequent processing. The formation of the hard mask 136 includes recessing the gate stacks 112 by selective etching; depositing (such as CVD) a hard mask; and CMP according to the present example. The hard mask 136 may include a suitable material different from the dielectric material of the ILD layers to achieve etching selectivity during the etching process to form contact openings. In some embodiments, the hard mask 136 includes silicon nitride. For examples, the hard mask 136 of silicon nitride (SiN) is formed by CVD using chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 11:
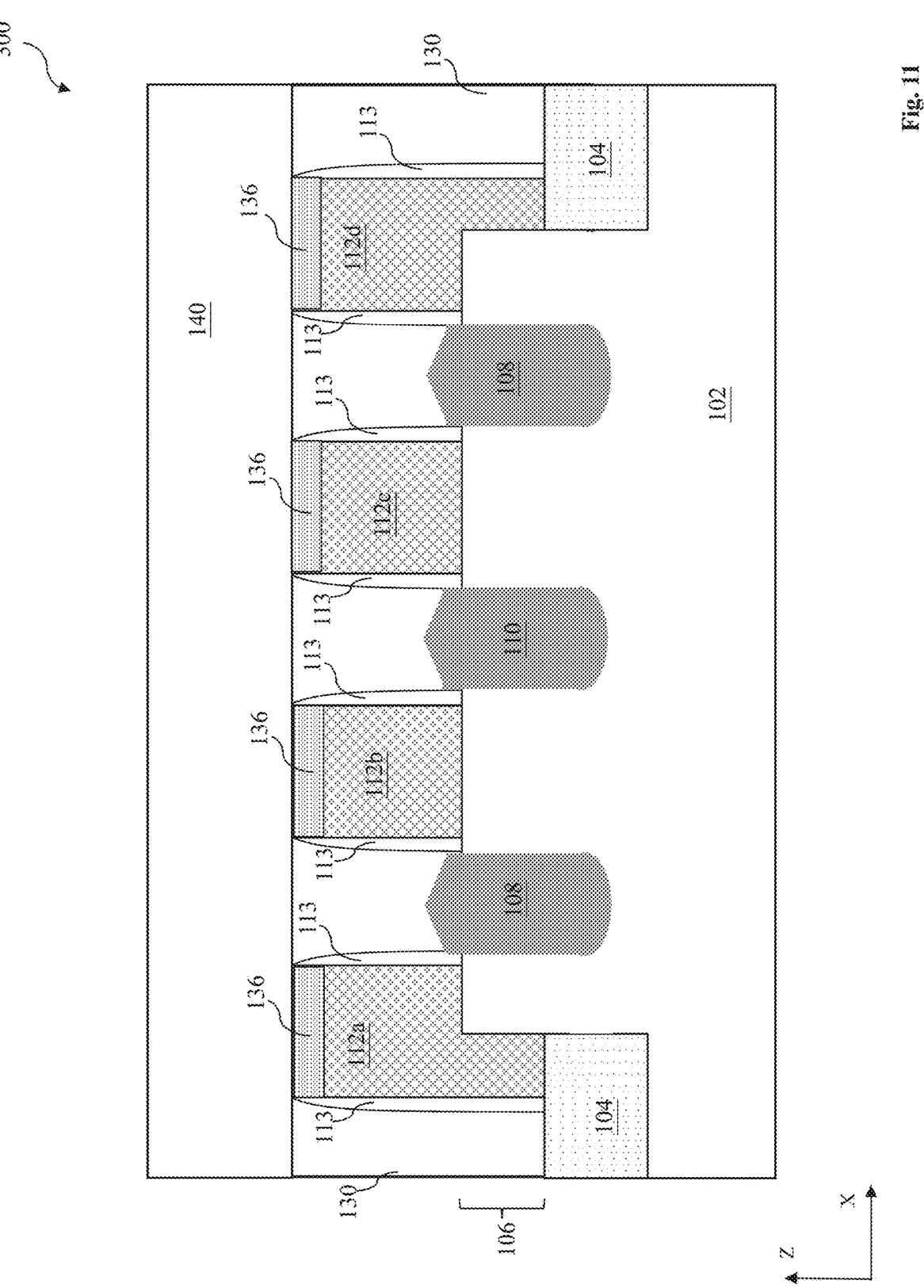
Figure 12:
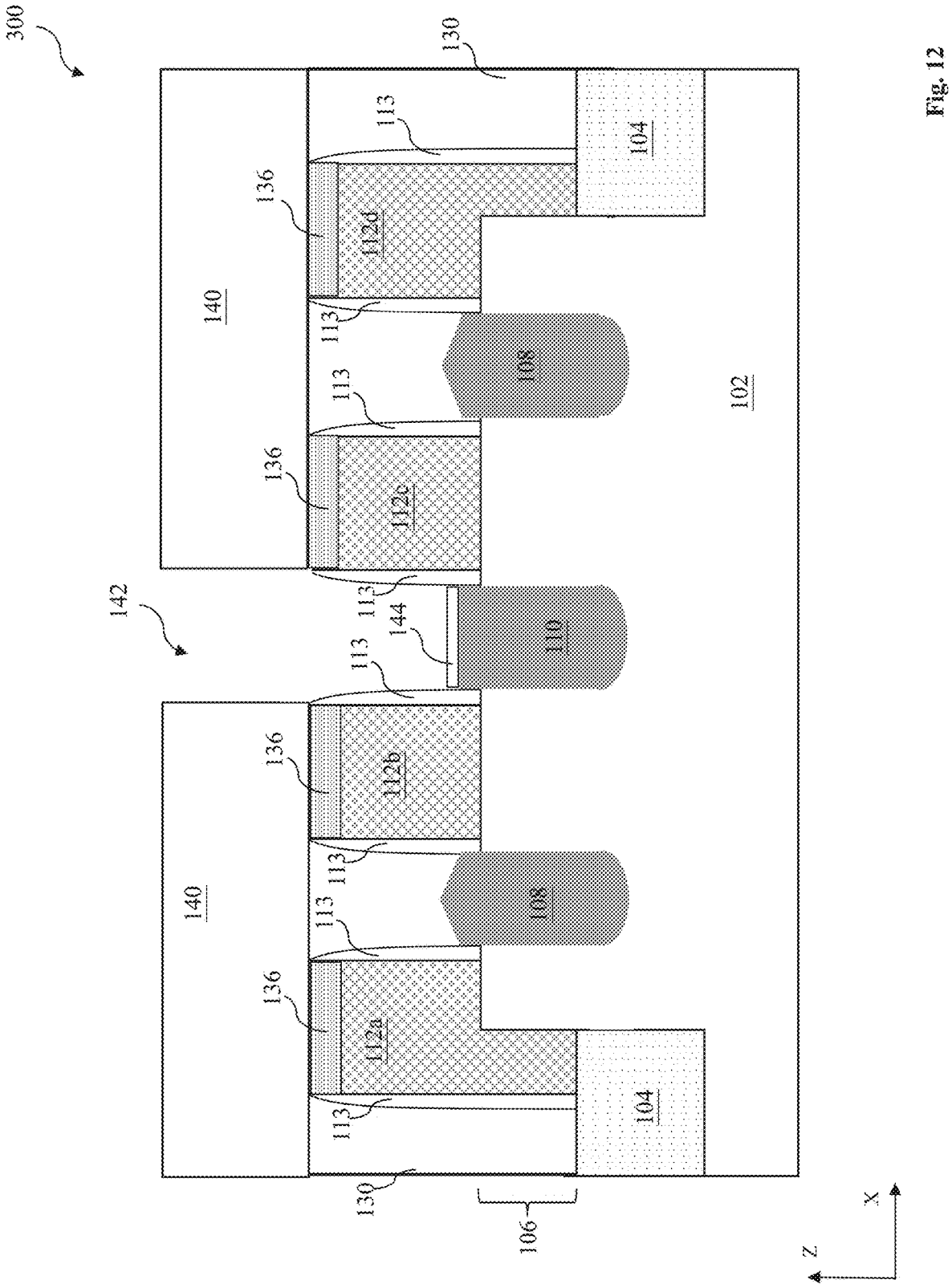
Figure 13:
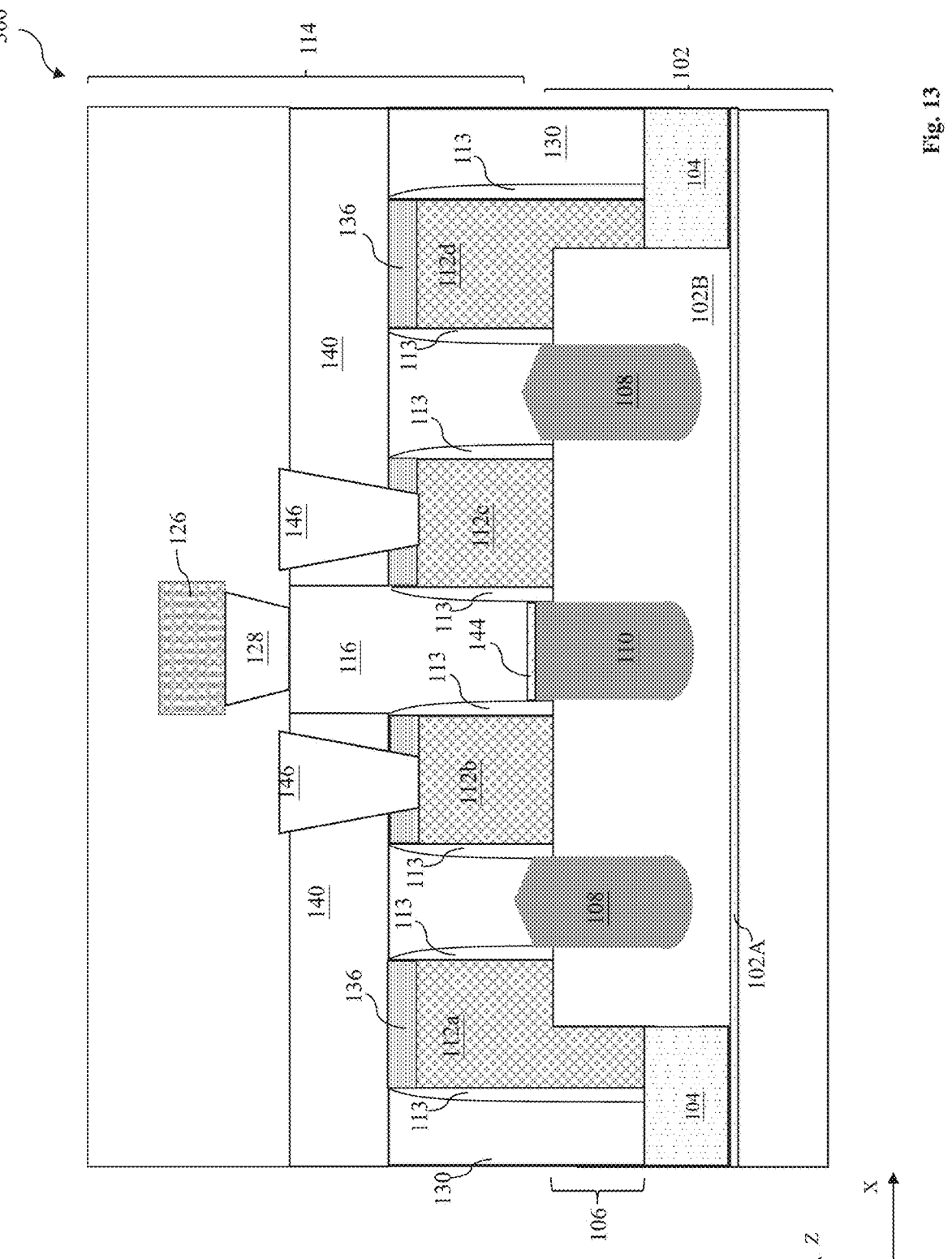

FIGS. 11~13 are sectional views of the semiconductor structure 300 at various fabrication stages constructed in accordance with some embodiments. The method 200 proceeds to an operation 216 by forming an interconnect structure 114 to connect FETs and various other devices to form an integrated circuit, as illustrated in FIGS. 11~13 and further illustrated in FIGS. 1A through 1F. The interconnect structure 114 is formed on the front side of the workpiece. The semiconductor structure 300 further includes power rails and other conductive features formed on the back side of the workpiece and collectively functioning with the interconnect structure 114 to connect the various devices into a functional integrated circuit.

The interconnect structure 114 includes metal lines in multiple metal layers to provide horizontal electrical routing and contact/via features to provide vertical routing. Various metal lines, contact features and via features in the interconnect structure 114 are formed by proper technique, such as damascene process. Especially, the interconnect structure 114 includes one or more contact feature 116 landing on transistors and/or other devices, such as a drain feature 110 of a FET. The operation 216 may include multiple steps to form one or more contact feature 116, as described in detail below.

Another ILD layer 140, similar to the ILD layer 130 in terms of composition and formation, is formed on the workpiece, as illustrated in FIG. 11. The formation of the ILD layer 140 may include deposition and CMP in some embodiments. The ILD layer 140 is further patterned to form one or more contact hole (or opening) 142 by lithography process and etching. A hard mask may be used to pattern the ILD layer 140. The etching process etches through the ILD layers 140 and 130 until one or more drain feature 110 is exposed, as illustrated in FIG. 12. In various patterning processes described above in the method 200, each patterning process may be implemented through double patterning or multiple patterning. In some embodiments, a silicide layer 144 is formed on the drain feature 110 to reduce the contact resistance, as illustrated in FIG. 12. The silicide layer 144 includes silicon and metal, such as titanium silicide, tantalum silicide, nickel silicide or cobalt silicide. The silicide layer 144 may be formed by a process referred to as self-aligned silicide (or salicide) process, which includes metal deposition, annealing to react the metal with silicon, and etching to remove the unreacted metal.

One or more contact feature 116 is formed in the contact hole(s) 142, as illustrated in FIG. 13. The contact hole 142 is filled with one or more conductive material, such as Ti, TiN, TaN, Co, W, Al, Cu, or combination. The formation of the contact feature 116 includes deposition of one or more conductive material and CMP according to some examples. The deposition may be implemented through proper deposition technique, such as physical vapor deposition (PVD), atomic layer deposition (ALD), plating, CVD or other suitable method.

Figure 1C:
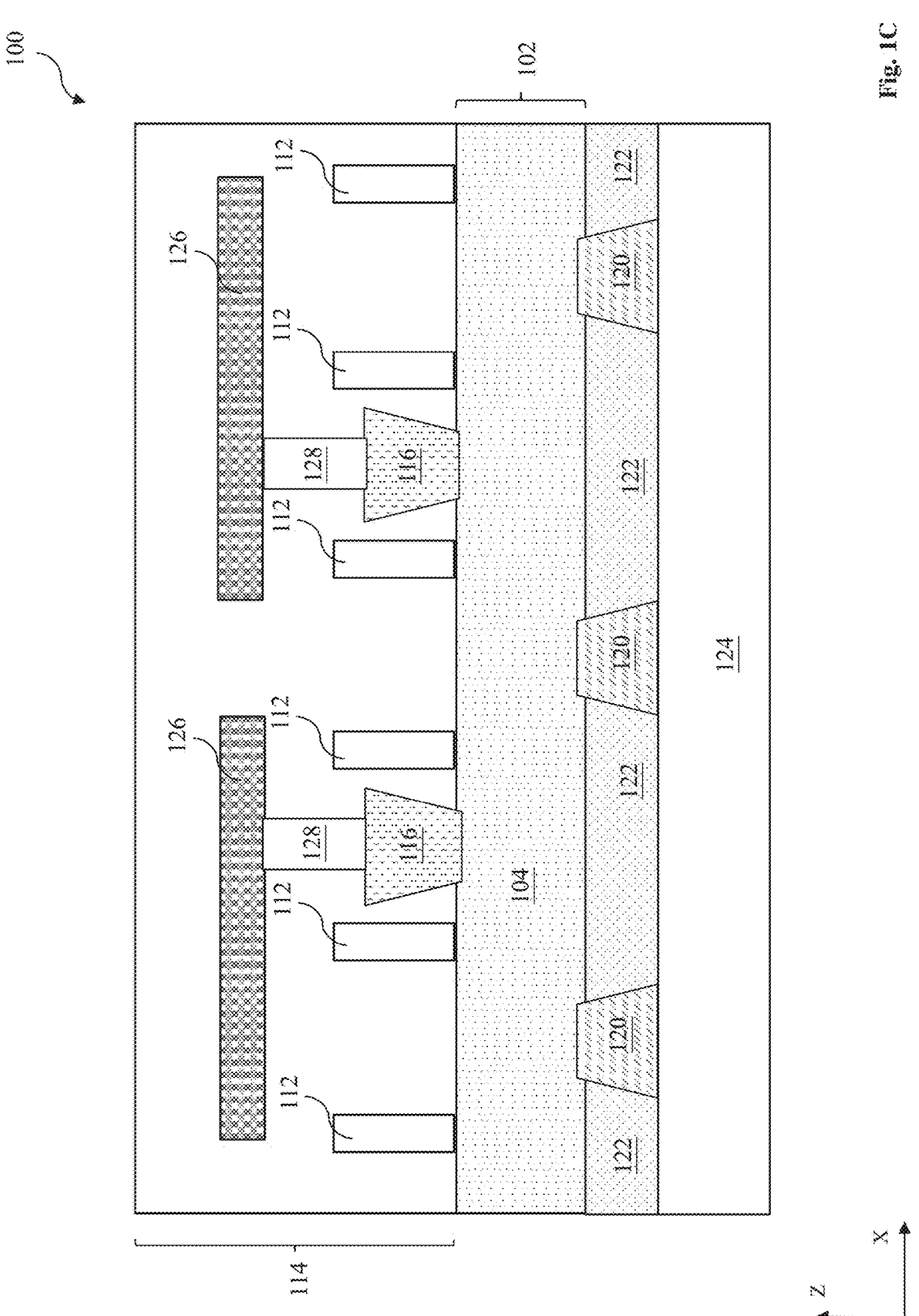
Figure 1D:
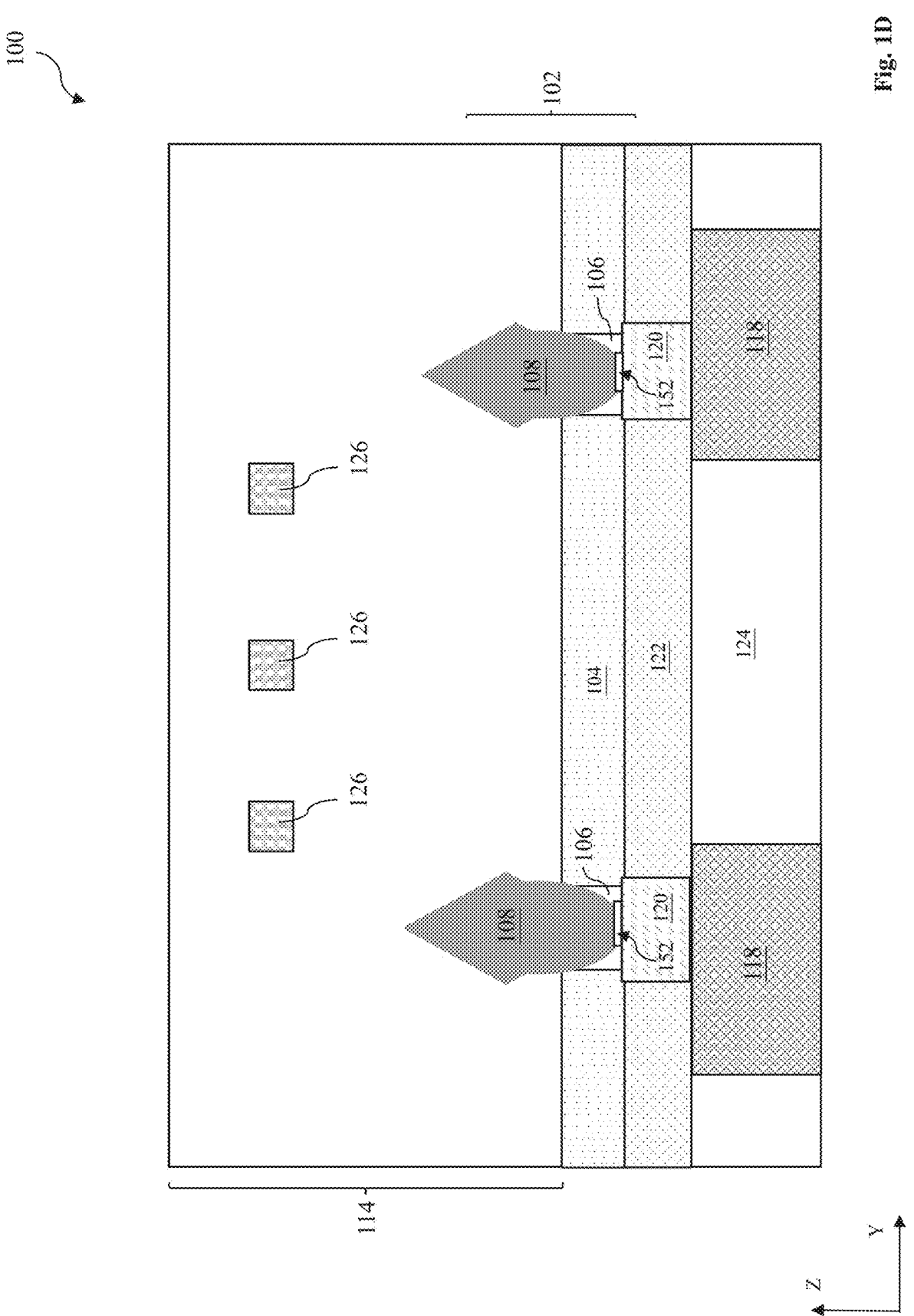
Figure 1E:
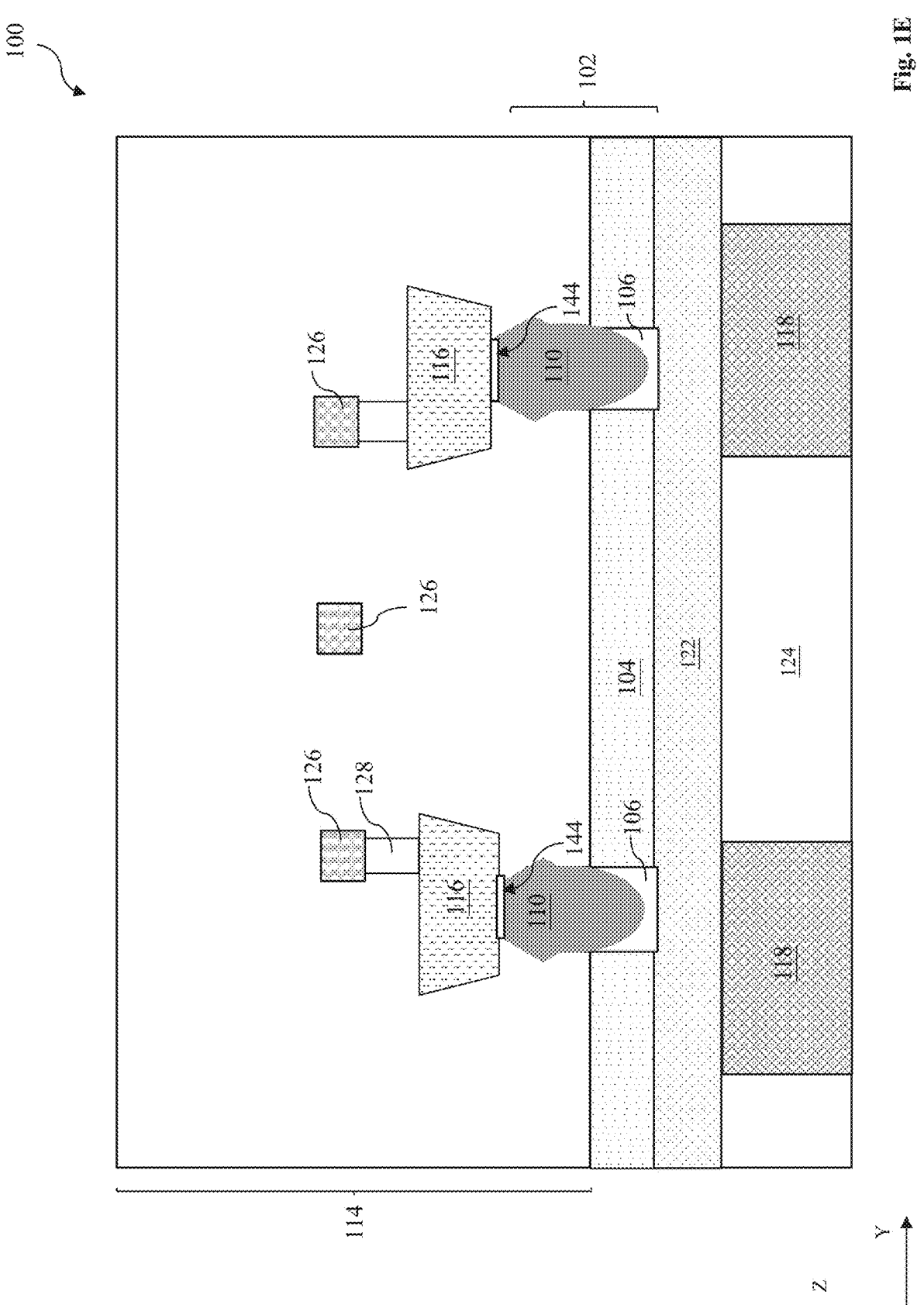
Figure 1F:
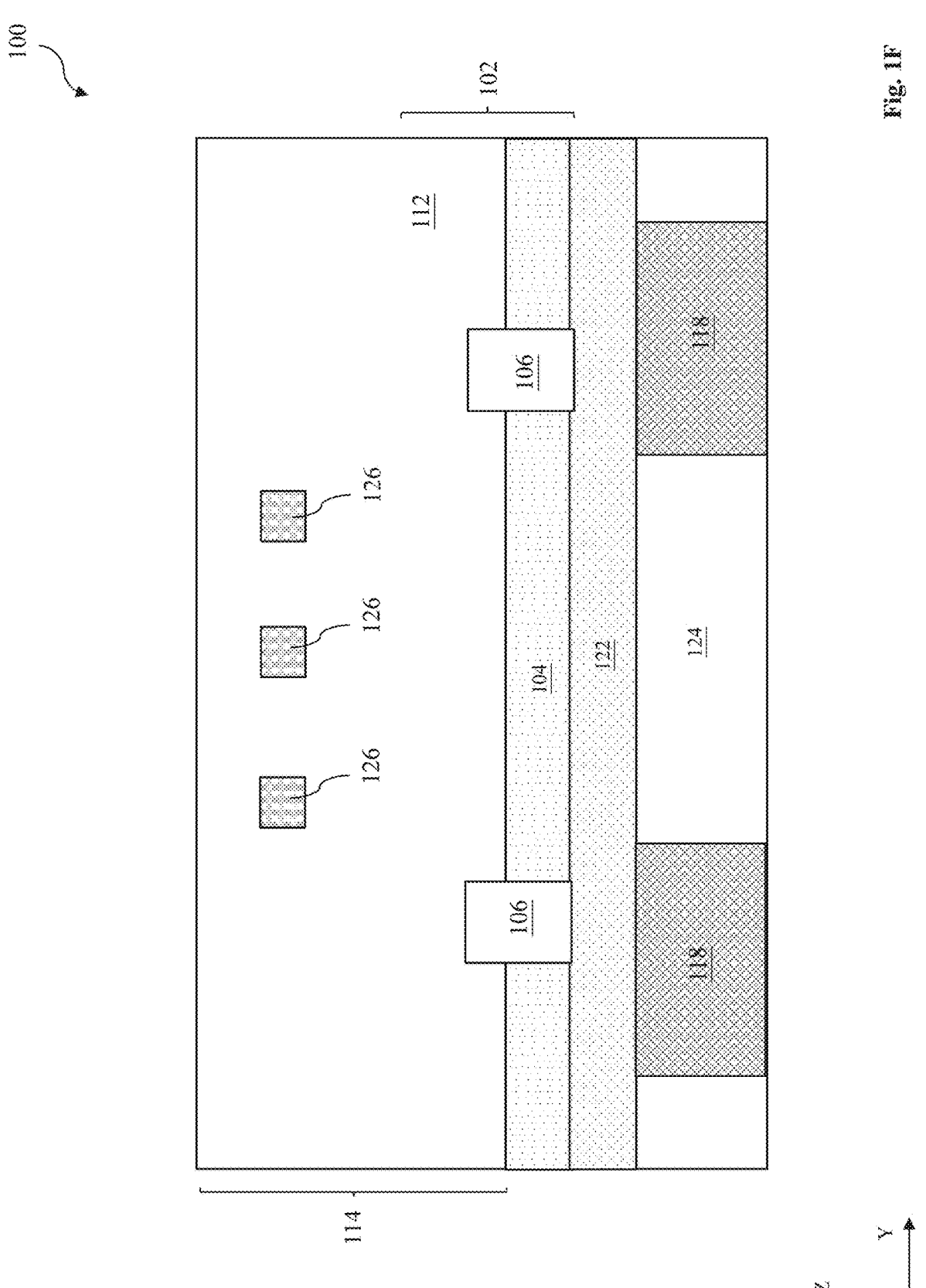

As noted above, the operation 216 also includes forming other conductive features, such as via features 128 landing on the contact feature 116, via features 146 landing on the gate electrodes 134, and the metal lines 126 in the first metal layer, of the interconnect structure 114, as illustrated in FIG. 13 or FIG. 1C. Furthermore, other detailed structures, such as semiconductor layers 102A and 102B, are illustrated on FIG. 13.

The method 200 also includes other operations, such as an operation 218 to perform various processes in the back end of line that includes: forming a passivation layer, forming redistribution layer (RDL), forming capacitors in the passivation layer, and forming bonding pads (not shown in FIG. 13). Then the workpiece 300 is proceeded for the subsequent operations on the back side of the workpiece, as illustrated in FIGS. 14~19. FIGS. 14~19 are sectional views of the semiconductor structure 300 along the fin active region 106, such as along the dashed line BB' of FIG. 6B but at various different fabrication stages.

Figure 14:
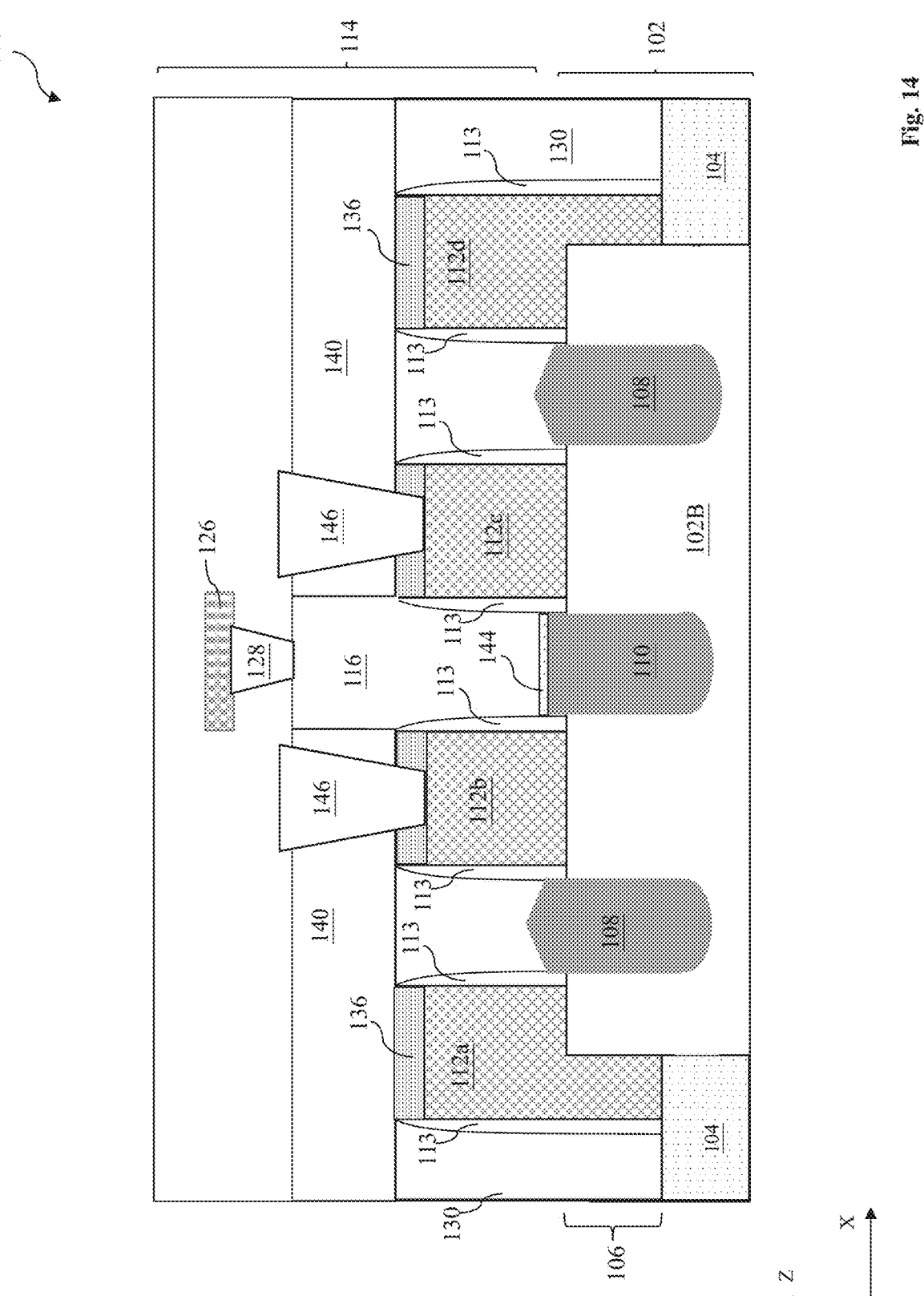

Referring to FIG. 14, the method 200 proceed to an operation 220 to thin down the semiconductor substrate of the workpiece 300 from the back side so that the active regions are exposed using suitable method, such as by polishing, etching or a combination thereof. In some embodiments, the polishing process may include CMP process. In some embodiments for enhanced throughput, the polishing process includes a grinding process with a higher polishing rate and then a CMP process with a higher polishing quality. In the present embodiment, the semiconductor substrate 102 includes an embedded semiconductor layer 102A functioning as a stop layer, such as a polish stop layer or alternatively an etch stop layer. When the embedded semiconductor layer 102A functions as a polish stop layer, the CMP process will stop on the embedded semiconductor layer 102A. When the embedded semiconductor layer 102A functions as an etch stop layer, following the CMP process, an etch process will be further applied to recess the semiconductor substrate 102 until it stops on the embedded semiconductor layer 102A. In the present embodiment where the semiconductor substrate 102 is a silicon substrate while the embedded semiconductor layer 102A is a silicon germanium layer, the etch process includes applying an etchant to selectively remove silicon relative to silicon germanium. In furtherance of embodiment, the etch process includes cryogenic deep reactive ion etching (DRIE) with $SF_6$ and $O_2$ to selectively etch silicon relative to silicon germanium. Thereafter, another etch process is applied to remove the embedded semiconductor layer 102A. For example, a dry etch process may be applied to selectively remove the embedded semiconductor layer 102A of SiGe using the etchant including HBr, $O_2$ and $N_2$. In another example, a wet etch process is applied to selectively remove the embedded semiconductor layer 102A of SiGe using a solution of $NH_4OH$, $H_2O_2$, and $H_2O$.

Figure 15:
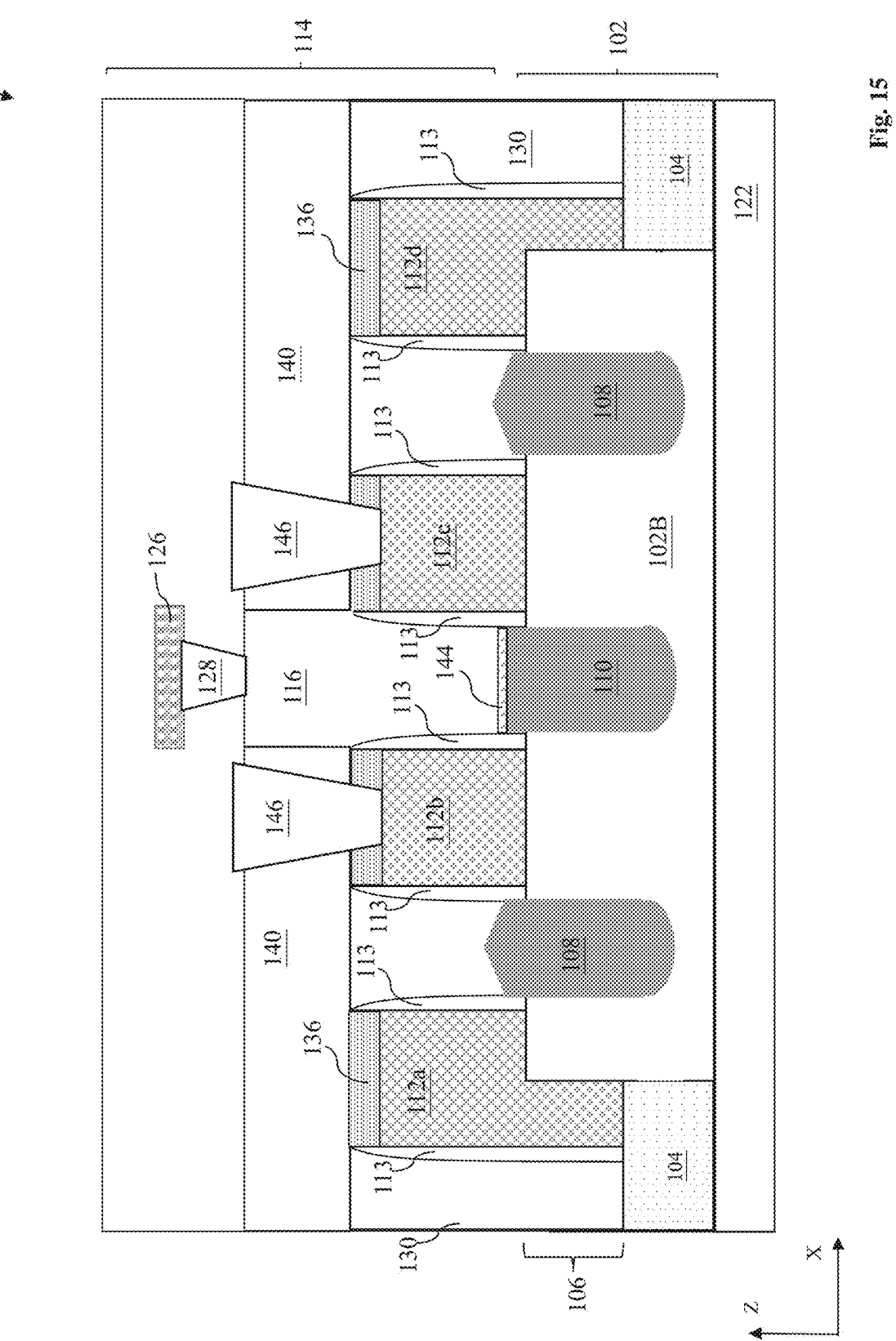

Referring to FIG. 15, the method 200 proceeds to an operation 222 by forming an isolation layer 122 on the back side of the workpiece 300. The isolation layer 122 is a dielectric material layer and may include silicon oxide, silicon nitride, silicon oxynitride, low-k dielectric material, other suitable dielectric material or a combination thereof. The isolation layer 122 may be formed by a suitable deposition technology, such as CVD, ALD, flowable CVD (FCVD) and may be followed by a CMP process. In some embodiments, the isolation layer 122 includes a thickness ranging between 10 nm and 30 nm.

Figure 16:
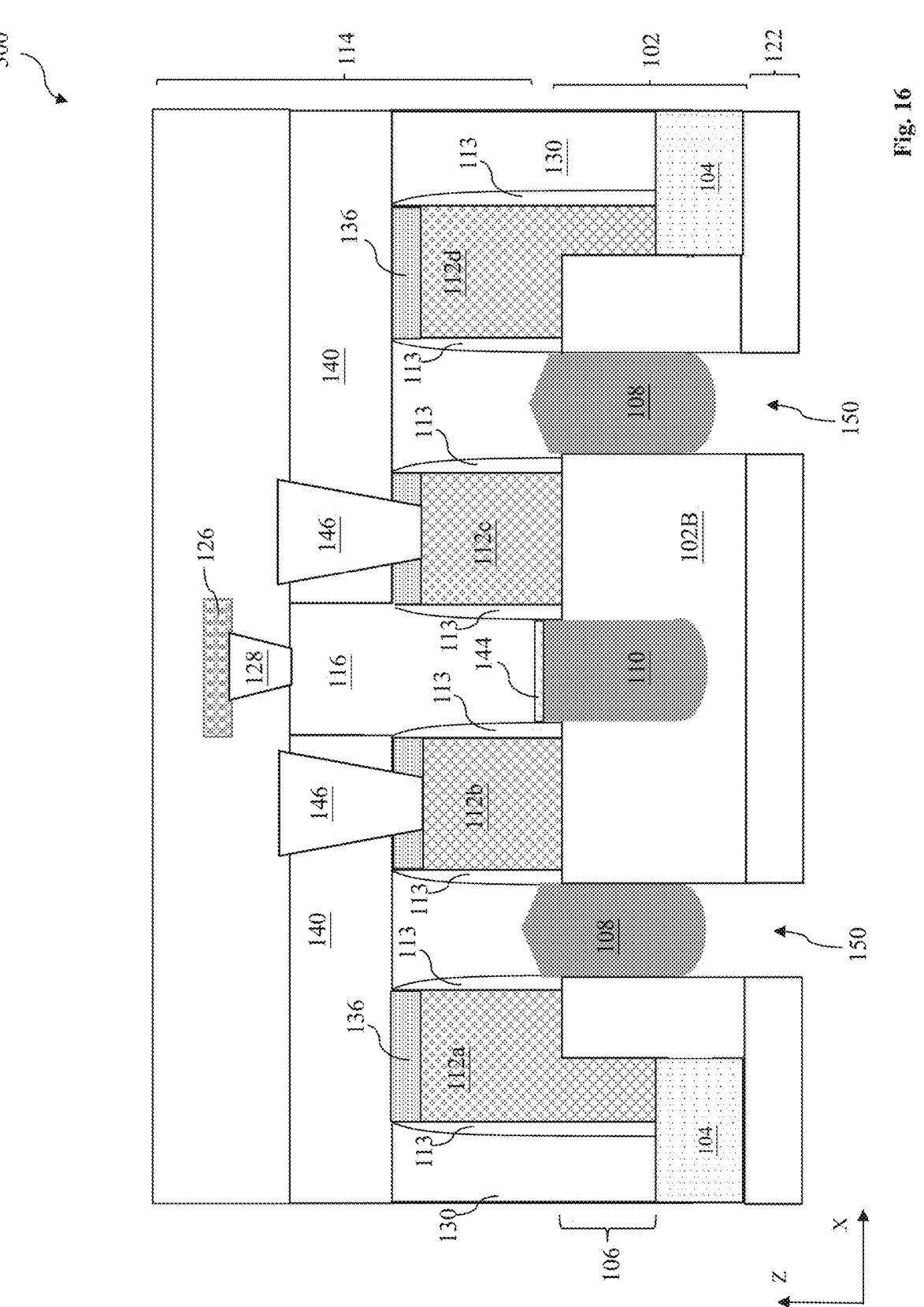

Referring to FIG. 16, the method 200 proceeds to an operation 224 to form one or more contact hole (or backside contact hole) 150 in the isolation layer 122 by a procedure that includes lithography process and etching. The method to form the backside contact hole 150 is similar to the method to form the front contact hole 142. In the present embodiment, the backside contact holes 150 are aligned with source features 108, in which the source features 108 are exposed within the corresponding backside contact holes 150. Particularly, the lithography process forms a patterned resist with an opening aligned with the source feature 108. The etching process transfers the opening to the isolation layer 122 to expose the source feature. In some embodiments, the etching process includes further etching to the semiconductor substrate 102, such as etching bottom portion of the fin active region to expose the source feature 108.

Figure 17:
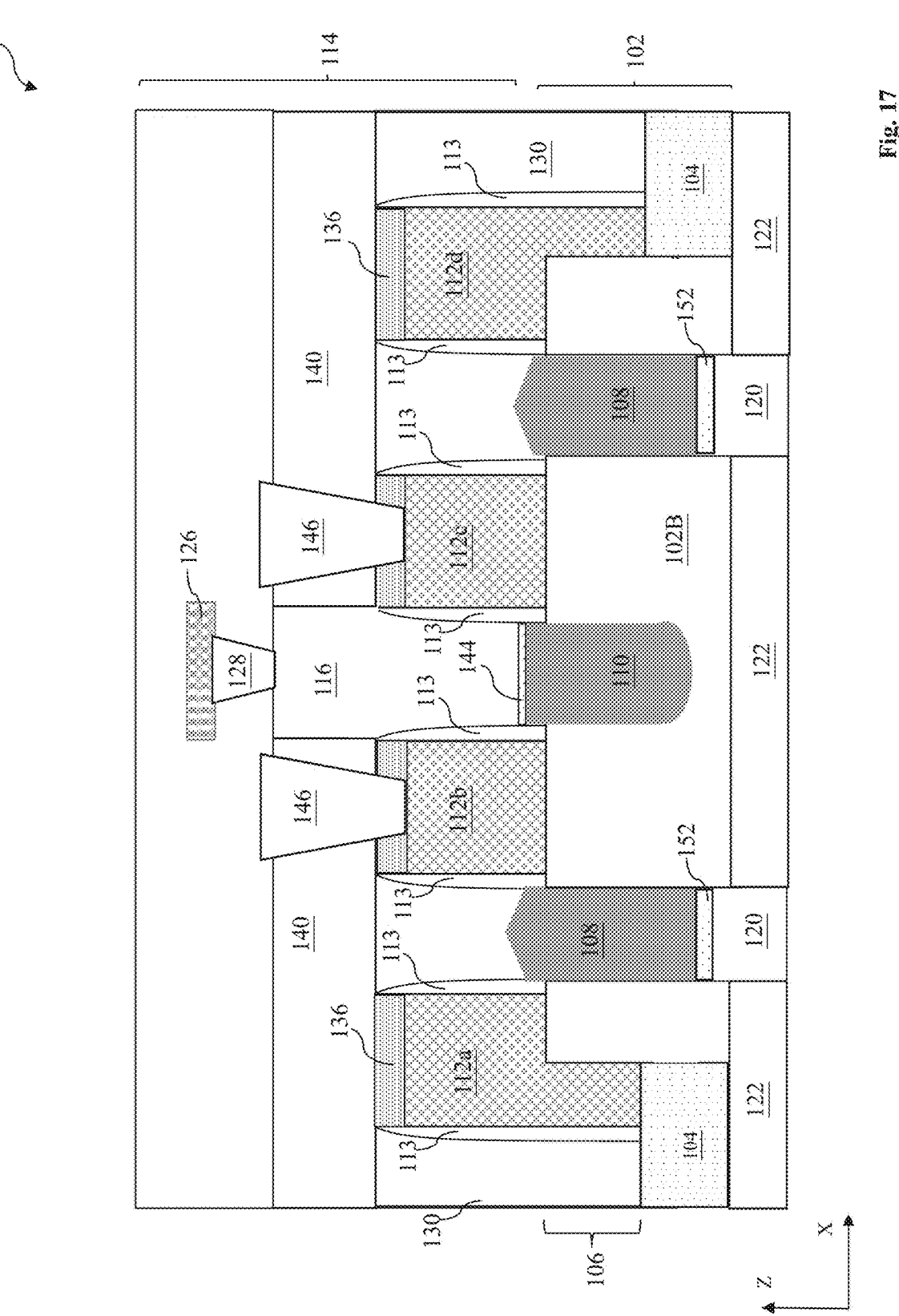

Referring to FIG. 17, the method 200 proceeds to an operation 226 to form one or more contact feature (also referred to as backside contact feature) 120 in the contact hole 150. In the present embodiment, a silicide layer 152 is formed on the source feature 108 to reduce the contact resistance. The silicide layer 152 includes silicon and metal, such as titanium silicide, tantalum silicide, nickel silicide or cobalt silicide. The silicide layer 152 is similar to the silicide layer 144 in terms of composition and formation. However, the silicide layer 152 is formed on the backside of the workpiece. Especially, the silicide layer 152 is formed on the bottom surface of the source feature 108 while the silicide layer 144 is formed on the top surface of the drain feature 110.

The contact hole 150 is filled with one or more conductive material, such as Ti, TiN, TaN, Co, W, Al, Cu, or combination. The formation of the backside contact feature 120 includes deposition of one or more conductive material and CMP according to some examples. The deposition may be implemented through proper deposition technique, such as PVD, ALD, plating, CVD or other suitable method. The formed backside contact feature 120 has a thickness similar to that of the isolation layer 122, such as in a range between 10 nm and 30 nm.

Figure 18:
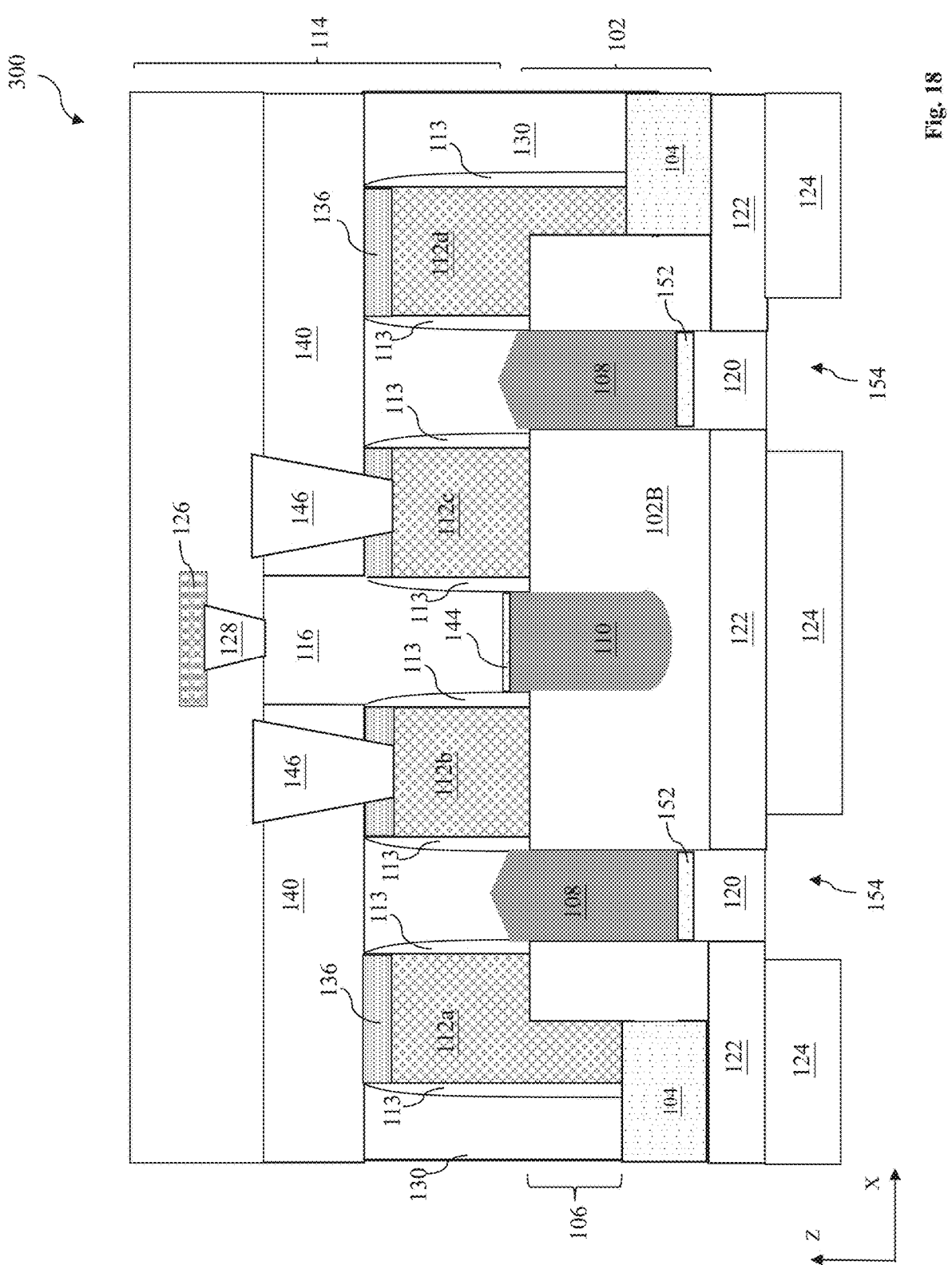

Referring to FIG. 18, the method 200 proceeds to an operation 228 to form another dielectric layer or a backside ILD (BILD) layer 124, similar to the ILD layer 130 in terms of composition and formation. The formation of the BILD layer 124 may include deposition and CMP in some embodiments.

Still referring to FIG. 18, the method 200 proceeds to an operation 230 to pattern the BILD layer 124 to form one or more trenches 154 by lithography process and etching. A hard mask may be used to pattern the BILD layer 124. An etching process is applied to etch through the BILD layers 124 until the backside contact feature 120 is exposed.

Figure 19:
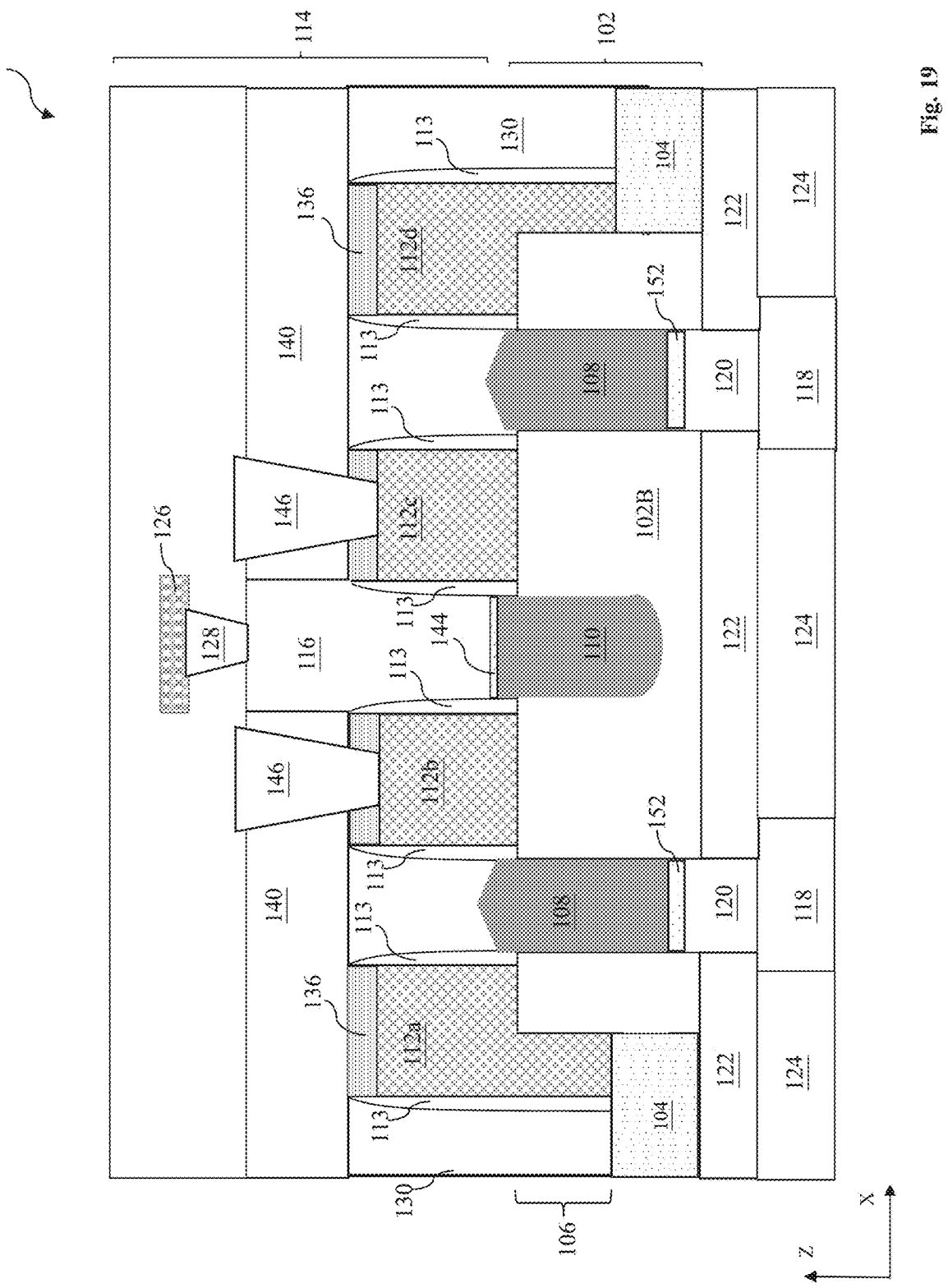

Referring to FIG. 19, the method 200 proceeds to an operation 232 to form one or more backside power rail (BPR) 118 in the trenches 154 of the BILD layer 124. The BPR 118 includes one or more conductive material, such as Ti, TiN, TaN, Co, W, Al, Cu, or combination thereof. The formation of the BPR 118 includes deposition of one or more conductive material and CMP according to some embodiments. The deposition may be implemented through proper deposition technique, such as PVD, ALD, plating, CVD, other suitable method or a combination thereof. Especially, the BPR 118 is designed and configured to be electrically connected to the FET through the backside contact feature 120, such as connecting to the source feature 108 of the FET in the present embodiment. Other fabrication steps may be implemented before, during and after the operations of the method.

The present disclosure provides a semiconductor structure having back power rails formed on the backside of the substrate and a method making the same in accordance with various embodiments. Such formed semiconductor structure includes backside power rails on the back side and the interconnect structure on the front side to collectively route power lines, such as the drain features being connected to the corresponding power lines through the interconnect structure and source features being connected to the corresponding power lines through the backside power rails. Especially, the semiconductor structure includes backside contact features landing on the source features from the back side and electrically connecting the backside power rails to the source features; and front contact features landing on the drain features and electrically connected to the upper level conductive features (e.g., metal lines) of the interconnect structure. Furthermore, both the front contact features and the backside contact features includes respective silicide layers to further reduce the contact resistances. The disclosed structure reduces routing resistance, enlarges alignment margins, increases layout flexibility, and enhances packing density. The disclosed structure provides more flexibility to circuit design layout and greater process window of IC fabrication, making the disclosed structure suitable for advanced technology nodes.

The disclosed structure can be used in various applications where FinFETs are incorporated for enhanced performance. For example, the FinFETs with multi-fin devices can be used to form static random-access memory (SRAM) cells. In other examples, the disclosed structure can be incorporated in various integrated circuits, such as logic circuit, dynamic random-access memory (DRAM), flash memory, or imaging sensor.

In one example aspect, the present disclosure provides a semiconductor structure in accordance with some embodiments. The semiconductor structure includes a substrate having a front side and a back side; a gate stack formed on the front side of the substrate and disposed on an active region of the substrate; a first source/drain feature formed on the active region and disposed at an edge of the gate stack; a backside power rail formed on the back side of the substrate; and a backside contact feature interposed between the backside power rail and the first source/drain feature, and electrically connecting the backside power rail to the first source/drain feature.

Another one aspect of the present disclosure pertains to a semiconductor structure. The semiconductor structure includes a substrate having a front side and a back side; a fin active region protruded out from the front side of the substrate; a gate stack disposed on the fin active region; a source feature and a drain feature formed on the fin active region and interposed by the gate stack; a front contact feature landing on the drain feature from the front side of the substrate; a backside power rail formed on the back side of the substrate; and a backside contact feature interposed between the backside power rail and the source feature, wherein the backside contact feature electrically connects the backside power rail to the source feature.

Yet another aspect of the present disclosure pertains to a method of forming an integrated circuit structure. The method includes receiving a substrate having a front surface and a back surface; forming a shallow trench isolation (STI) feature in the front surface of the substrate, thereby defining a fin active region surrounded by the STI feature; forming a gate stack on the fin active region; forming a source feature and a drain feature on the fin active regions, wherein the gate stack spans from the source feature to the drain feature; forming an interconnect structure on the gate stack, the source feature and the drain feature from the front surface, wherein the interconnect structure includes a front contact feature contacting the drain feature; thinning down the substrate from the back surface such that source feature is exposed with an exposed surface; forming a backside contact feature landing on the exposed surface of the source feature; and forming a backside power rail landing on the backside contact feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a substrate having a front side and a back side;
a gate stack formed on the front side of the substrate and disposed on an active region of the substrate;
a first source/drain feature formed on the active region and disposed at an edge of the gate stack;
a shallow trench isolation (STI) feature being adjacent the active region, wherein the active region is an active region extruded above a top surface of the STI feature;
a backside power rail formed on the back side of the substrate;
a backside contact feature interposed between the backside power rail and the first source/drain feature, and electrically connecting the backside power rail to the first source/drain feature, wherein the backside contact feature further includes a first silicide layer disposed on the back side of the substrate and in direct contact with a bottom surface of the first source/drain feature;
a first dielectric material layer disposed on the active region from the back side; and
a second dielectric material layer disposed on the first dielectric material layer,
wherein the backside contact feature is embedded in the first dielectric material layer, and the backside power rail is embedded in the second dielectric material layer.

2. The semiconductor structure of claim 1, wherein the backside contact feature further extends into the first source/drain feature with an increased contact area.

3. The semiconductor structure of claim 1, further comprising:
a second source/drain feature formed on the active region; and
an interconnect structure formed on the gate stack, wherein the interconnect structure further includes a front contact feature directly contacting the second source/drain feature.

4. The semiconductor structure of claim 3, wherein the front contact feature includes a second silicide layer disposed on the front side of the substrate and in direct contact with a top surface of the second source/drain feature.

5. The semiconductor structure of claim 4, wherein the gate stack is a first gate stack and further comprising:
a second gate stack adjacent to the first gate stack along a lengthwise direction of the active region,
wherein a portion of the second source/drain feature is directly between the first and second gate stacks,
wherein the second silicide layer is directly between the first and second gate stacks.

6. The semiconductor structure of claim 1, wherein the first and second dielectric material layers are different in composition.

7. The semiconductor structure of claim 6, wherein a top surface of the first dielectric material layer directly contacts the STI feature.

8. The semiconductor structure of claim 7, wherein the top surface of the first dielectric material layer is below a bottom surface of the first silicide layer.

9. The semiconductor structure of claim 1, wherein the first silicide layer is embedded in the active region such that it has a bottom surface above a bottom surface of the active region.

10. The semiconductor structure of claim 1, wherein the backside contact feature spans a greater thickness than the first dielectric material layer.

11. A semiconductor structure, comprising:
a substrate having a front side and a back side;
an active region protruded out from the front side of the substrate;
a shallow trench isolation (STI) feature adjacent the active region, wherein the active region protrudes above a top surface of the STI feature;
a gate stack disposed on the active region;
a source feature and a drain feature formed on the active region and interposed by the gate stack, wherein the source and the drain features span vertically from below the top surface of the STI feature to above the top surface of the STI feature;
a front contact feature landing on the drain feature from the front side of the substrate;
a backside power rail formed on the back side of the substrate; and
a backside contact feature interposed between the backside power rail and the source feature, wherein the backside contact feature electrically connects the backside power rail to the source feature, and the backside contact feature is partially laterally surrounded by the active region, wherein
the backside contact feature includes a first silicide layer disposed on the back side and in direct contact with the source feature, wherein the first silicide layer is completely laterally surrounded by the active region and has a bottom surface above a bottom surface of the active region, and
the front contact feature includes a second silicide layer disposed on the front side and in direct contact with the drain feature.

12. The semiconductor structure of claim 11, wherein
the first silicide layer directly contacts a bottom surface of the source feature; and
the second silicide layer directly contacts a top surface of the drain feature.

13. The semiconductor structure of claim 12, further comprising a gate spacer along a sidewall of the gate stack, wherein the front contact feature directly contacts the gate spacer.

14. The semiconductor structure of claim 11, further comprising a first dielectric material layer disposed on the active region and on the STI feature from the back side of the substrate; and a second dielectric material layer disposed on the first dielectric material layer, wherein the backside contact feature is embedded in the first dielectric material layer, the backside power rail is embedded in the second dielectric material layer, and the first and second dielectric material layers are different in composition.

15. The semiconductor structure of claim 11, wherein each of the source and drain features protrudes above a top surface of the active region.

16. A semiconductor structure, comprising:

a substrate having a front side and a back side;

gate stacks formed on the front side of the substrate and disposed on an active region of the substrate;

a shallow trench isolation (STI) feature adjacent to the active region, wherein the active region protrudes vertically above the STI feature;

a source feature formed on the active region and disposed between two of the gate stacks;

a first dielectric material layer disposed on the back side of the substrate and in direct contact with the active region and on the STI feature;

a second dielectric material layer disposed on the first dielectric material layer;

a backside contact feature on the back side of the substrate, the backside contact feature having a backside silicide layer in direct contact with a bottom surface of the source feature; and a backside power rail landing the backside contact feature, wherein the backside contact feature is embedded in the first dielectric material layer, the backside power rail is embedded in the second dielectric material layer, and the first and second dielectric material layers are different in composition.

17. The semiconductor structure of claim 16, wherein one of the two of the gate stacks is formed directly on the STI feature and directly on the active region.

18. The semiconductor structure of claim 16, wherein a portion of the backside contact feature is also embedded in the active region.

19. The semiconductor structure of claim 16, further comprising a drain feature formed on the active region on the front side of the substrate, the drain feature disposed across the source feature by one of the gate stacks; and a frontside contact feature having a frontside silicide layer in direct contact with a top surface of the drain feature, wherein the frontside contact feature extends a first distance vertically along a first direction, the backside contact feature extends a second distance vertically along a second direction, and the first distance is greater than the second distance.

20. The semiconductor structure of claim 16, wherein the backside contact feature partially penetrates the active region to span a greater thickness than the first dielectric material layer.

* * * * *